United States Patent
Yerli

(10) Patent No.: US 11,301,951 B2
(45) Date of Patent: Apr. 12, 2022

(54) GAME ENGINE AND ARTIFICIAL INTELLIGENCE ENGINE ON A CHIP

(71) Applicant: THE CALANY HOLDING S.ÁR.L., Luxembourg (LU)

(72) Inventor: Cevat Yerli, Frankfurt am Main (DE)

(73) Assignee: THE CALANY Holding S. À R.L., Luxembourg (LU)

( * ) Notice: Subject to any disclaimer, the term of this patent is extended or adjusted under 35 U.S.C. 154(b) by 0 days.

(21) Appl. No.: 16/298,778

(22) Filed: Mar. 11, 2019

(65) Prior Publication Data
US 2019/0287208 A1    Sep. 19, 2019

Related U.S. Application Data

(60) Provisional application No. 62/643,524, filed on Mar. 15, 2018.

(51) Int. Cl.
*G06T 1/20* (2006.01)
*G06T 15/00* (2011.01)
(Continued)

(52) U.S. Cl.
CPC ............... *G06T 1/20* (2013.01); *A63F 13/52* (2014.09); *A63F 13/67* (2014.09); *G06F 30/20* (2020.01);
(Continued)

(58) Field of Classification Search
CPC ........... G06T 1/20; G06T 15/005; G06T 1/60; G06N 20/10; G06N 3/006; G06N 3/04;
(Continued)

(56) References Cited

U.S. PATENT DOCUMENTS 6,570,564 B1   5/2003   Sowizral et al.
6,816,750 B1   11/2004  Klaas
(Continued)

FOREIGN PATENT DOCUMENTS

EP           2437217 A2    4/2012
KR    10-2010-0003518 A    7/2011
(Continued)

OTHER PUBLICATIONS

Almagbile, A.F.S., "GNSS/INS Integration for Positioning and Navigation: Modelling and Quality Analysis," Doctoral Dissertation, University of Jordan, Amman, Jordan, 2003, 217 pages.
(Continued)

*Primary Examiner* — Jacinta M Crawford
(74) *Attorney, Agent, or Firm* — Christensen O'Connor Johnson Kindness PLLC

(57) ABSTRACT

An electronic chip, a chip assembly, a computing device, and a method are described. The electronic chip comprises a plurality of processing cores and at least one hardware interface coupled to at least one of the one or more processing cores. At least one processing core implements a game engine and/or a simulation engine and one or more processing cores implements an artificial intelligence engine, whereby implementations are on-chip implementations in hardware by dedicated electronic circuitry. The one or more game and/or simulation engines perform tasks on sensory data, generating data sets that are processed through machine learning algorithms by the hardwired artificial intelligence engine. The data sets processed by the hardwired artificial intelligence engine include at least contextual data and target data, wherein combining both data and processing by dedicated hardware results in enhanced machine learning processing.

19 Claims, 24 Drawing Sheets

(51) Int. Cl.
*G06K 9/62* (2022.01)
*G06N 20/10* (2019.01)
*A63F 13/67* (2014.01)
*A63F 13/52* (2014.01)
*G06F 30/20* (2020.01)
*G06N 20/20* (2019.01)
*G06N 5/02* (2006.01)
*G06N 5/00* (2006.01)
*G06N 3/08* (2006.01)
*G06N 3/00* (2006.01)
*G06N 7/00* (2006.01)
*G06N 3/04* (2006.01)

(52) U.S. Cl.
CPC .......... *G06K 9/6223* (2013.01); *G06N 20/10* (2019.01); *G06T 15/005* (2013.01); *A63F 2300/20* (2013.01); *G06N 3/006* (2013.01); *G06N 3/04* (2013.01); *G06N 3/08* (2013.01); *G06N 5/003* (2013.01); *G06N 5/025* (2013.01); *G06N 7/005* (2013.01); *G06N 20/20* (2019.01)

(58) Field of Classification Search
CPC .......... G06N 3/08; G06N 5/003; G06N 5/025; G06N 7/005; G06N 20/20; G06F 17/5009; G06F 30/20; G06K 9/6223; A63F 13/52; A63F 13/67; A63F 2300/20
USPC ................................. 345/501, 502, 519, 541
See application file for complete search history.

(56) References Cited

U.S. PATENT DOCUMENTS

| | | | |
|---|---|---|---|
| 8,200,594 B1* | 6/2012 | Bleiweiss | G06T 19/003 345/474 |
| 9,443,192 B1 | 9/2016 | Cosic | |
| 2005/0086040 A1 | 4/2005 | Davis et al. | |
| 2005/0128203 A1 | 6/2005 | Huang et al. | |
| 2006/0106591 A1 | 5/2006 | Bordes et al. | |
| 2006/0139358 A1* | 6/2006 | Cho | A63F 13/10 345/506 |
| 2006/0232590 A1* | 10/2006 | Bakalash | G06F 3/1423 345/502 |
| 2006/0248543 A1 | 11/2006 | Jin et al. | |
| 2007/0154082 A1 | 7/2007 | Rhodes | |
| 2007/0155506 A1 | 7/2007 | Malik | |
| 2008/0059769 A1 | 3/2008 | Rymarczyk et al. | |
| 2009/0102844 A1 | 4/2009 | Deparis | |
| 2009/0197686 A1* | 8/2009 | Bergelt | A63F 13/577 463/43 |
| 2010/0035637 A1 | 2/2010 | Varanasi et al. | |
| 2011/0167945 A1 | 7/2011 | Yang et al. | |
| 2011/0242427 A1 | 10/2011 | Ramsdale | |
| 2012/0069023 A1 | 3/2012 | Hur et al. | |
| 2014/0161173 A1* | 6/2014 | Azar | H04N 19/20 375/240.01 |
| 2014/0168236 A1 | 6/2014 | Keefe et al. | |
| 2015/0015253 A1 | 1/2015 | Mori et al. | |
| 2015/0106673 A1 | 4/2015 | Huang et al. | |
| 2015/0251092 A1 | 9/2015 | Chu et al. | |
| 2015/0255131 A1 | 9/2015 | Byeon et al. | |
| 2016/0117152 A1 | 4/2016 | Baker | |
| 2017/0010098 A1* | 1/2017 | Georgy | G01S 19/42 |
| 2017/0011288 A1 | 1/2017 | Brothers et al. | |
| 2017/0075858 A1 | 3/2017 | Yerli | |
| 2017/0243403 A1 | 8/2017 | Daniels et al. | |
| 2017/0323224 A1 | 11/2017 | Bruestle et al. | |
| 2018/0018590 A1* | 1/2018 | Szeto | G06F 21/6254 |
| 2018/0140942 A1 | 5/2018 | Miller et al. | |
| 2019/0205735 A1* | 7/2019 | Smelyanskiy | G06F 17/16 |
| 2019/0236606 A1* | 8/2019 | Padmanabhan | G06Q 20/3821 |

FOREIGN PATENT DOCUMENTS

| | | |
|---|---|---|
| WO | 2014/105865 A1 | 7/2014 |
| WO | 2017/046354 A1 | 3/2017 |
| WO | 2017/086922 A1 | 5/2017 |

OTHER PUBLICATIONS

Carr, N.A., et al., "The Ray Engine," Proceedings of the ACM SIGGRAPH/Eurographics Conference on Graphics Hardware, Saarbrucken, Germany, Sep. 1-2, 2002, pp. 1-10.

Crassin, C., et al., "Interactive Indirect Illumination Using Voxel Cone Tracing," Computer Graphics Forum 30(7):1921-1930, 2011.

Dupire, J., et al., "Using Game Engines for Non 3D Gaming Applications," Proceedings of the International Conference on Computer Games (CGAMES '05), Angouleme, France, Jan. 2005, pp. 304-307.

Jouppi, N.P., et al., "In-Datacenter Performance Analysis of a Tensor Processing Unit™," Proceedings of the 44th International Symposium on Computer Architecture (ISCA), Toronto, Canada, Jun. 26, 2017, 17 pages.

Lucas-Sabola, V., et al., "GNSS IoT Positioning: From Conventional Sensors to a Cloud-Based Solution," IG Inside GNSS, Jun. 15, 2018, <https://insidegnss.com/gnss-iot-positioning-from-conventional-sensors-to-a-cloud-based-solution/> [retrieved Feb. 11, 2019], 33 pages.

Van Lent, M., and J.E. Laird, "Developing an Artificial Intelligence Engine," Proceedings of the Game Developers Conference, San Jose, Calif., Mar. 16-18, 1999, 12 pages.

Yin, L., et al., "A GNSS-5G Integrated Positioning Methodology in D2D Communication Networks," IEEE Journal on Selected Areas in Communications 36(2):351-362, Feb. 2018.

Extended European Search Report dated Sep. 25, 2019, issued in corresponding European Application No. 19163040.9, 0 pages.

"Game Engine," Wikipedia, The Free Encyclopedia, Mar. 10, 2018, <https://en.wikipedia.org/w/index.php?title=Game_engine&oldid=829745391> [retrieved Dec. 9, 2019], 8 pages.

An In-Depth Look at Google's First Tensor Processing Unit (TPU), from <cloud.google.com/blog/products/gcp/an-in-depth-look-at-googles-first-tensor-processing-unit-tpu> [retrieved Sep. 16, 2019], 16 pages.

Office Action dated Apr. 18, 2017, issued in U.S. Appl. No. 15/047,556, filed Feb. 18, 2016, 27 pages.

Office Action dated Dec. 1, 2017, issued in U.S. Appl. No. 15/047,556, filed Feb. 18, 2016, 26 pages.

Office Action dated Jan. 3, 2019, issued in U.S. Appl. No. 15/047,556, filed Feb. 18, 2016, 37 pages.

International Search Report and Written Opinion, dated Jan. 3, 2017, issued in International Application No. PCT/EP2016/072018, filed Sep. 16, 2016, 25 pages.

Office Action dated Jun. 12, 2018, issued in U.S. Appl. No. 15/047,556, filed Feb. 18, 2016, 41 pages.

Barbic, J., "Multi-Core Architectures," May 3, 2007, https://www.cs.cmu.edu/~fp/courses/15213-s07/lectures/27-multicore.pdf [retrieved Sep. 27, 2019], 67 pages.

Extended European Search Report dated Oct. 23, 2020, issued in European Application No. EP 20180743.5, filed Jun. 18, 2020, 9 pages.

Challenges in GNSS/INS Integration, Thought Leadership Series, articles sponsored by NovAtel Inc., Feb. 11, 2012, 2 pages.

Skog, I., "Sensor Fusion GPS+IMU," Module 1—Sensing and Perception, 2016, 9 pages.

Usman, M., et al., "Technologies and Solutions for Location-Based Services in Smart Cities: Past, Present, and Future," IEEE Access, vol. 6, 2018, pp. 22240-22248.

Office Action dated May 12, 2021, issued in U.S. Appl. No. 16/904,033, filed Jun. 20, 2020, 56 pages.

Office Action dated Feb. 8, 2021, issued in Chinese Application No. 201680053259.X, (Chinese version) 10 pages.

Office Action dated May 14, 2021, issued in Chinese Application No. 201680053259.X, (Chinese version) 11 pages.

(56) References Cited

OTHER PUBLICATIONS

Office Action dated Aug. 21, 2020, issued in Chinese Application No. 201680053259.X, (Chinese version) 11 pages.
Office Action dated Nov. 4, 2021, in European application No. 16 775 106.4, 8 pages.
Office Action dated Nov. 8, 2021, in corresponding European application No. 19 163 040.9, 7 pages.

* cited by examiner

GAME ENGINE AND ARTIFICIAL INTELLIGENCE ENGINE ON A CHIP

CROSS-REFERENCE(S) TO RELATED APPLICATION(S)

This application claims the benefit of Provisional Application No. 62/643,524, filed Mar. 15, 2018, the entire disclosure of which is hereby incorporated by reference herein for all purposes.

This application is related by subject matter to U.S. patent application Ser. No. 15/047,556.

BACKGROUND

Game engines and simulation engines play an increasingly important role in graphics applications. One major task of such engines is to provide the most realistic and highest quality of graphics possible at a real-time performance comprising other features such as simulation capabilities. A software engine is typically provided as computer-executable code that is executed on a CPU. For example, the engine may typically run on a processor or microprocessor of a computing device, such as a CPU of a personal computer, a console, a mobile phone or a tablet. Hence, performance of the CPU may determine the performance of a software engine. The software engine may also access a graphics processing unit GPU. For example, the GPU can render lists of individual objects with a very high performance to graphics memory or video memory. A computer graphics scene may include a large number of objects with characteristics related to their 3D position and 3D orientation, behavior, material properties and the like. In order to achieve highly realistic scenes, the engine needs to consider the whole scene, which may often contain millions of objects that are to be rendered to the screen. For example, the engine may consider the behavior and interaction of light with individual objects and between the objects of the scene.

These engines offer an environment created specially to execute the functionalities that are specific to 3D video games and real-time simulations. Thus, engines enable functionality such as the management of an animated model, the collisions between objects, and the interaction between the player and the game. Many recent games, simulations and serious games use engines that go beyond visual and interaction aspects. For example, programmers can rely on a software physics engine to simulate physical laws within the virtual environment, a software audio engine to add music and complex acoustical effects, and a software artificial intelligence (AI) engine to program non-human players' behaviors. Properties expected for a 3D interface are very close to the ones for 3D video games. Thus, game engines may be used in any type of application that requires rendering of 3D graphics at a real-time performance, including applications in Virtual Reality (VR), Augmented Reality (AR), Mixed Reality (MR), or combinations thereof.

Specific developments in AI that are used in gaming and non-gaming applications have been enabled by an increase in computing power and availability of large data sets which may be used for machine learning. In one possible application of machine learning, known as supervised learning, a programmer gives a computer a set of sample data and a desired outcome, and the computer generates its own model on the basis of those data that it can apply to any future data. Other machine learning approaches include unsupervised learning and reinforcement learning. Within these broad approaches, many techniques can be applied including feature learning, anomaly detection, decision trees, artificial neural networks, Bayesian networks, and genetic algorithms.

Artificial intelligence functionality for gaming and non-gaming applications has been executed in computing devices by processing units such as CPUs and GPUs. However, as CPUs are all-purpose processors, performing artificial intelligence tasks has been inefficient. In contrast, some GPUs are good candidates for implementing AI applications, since they typically contain many more processing cores and can execute more software threads simultaneously. Thus, GPUs have expanded outside the graphics and video areas and into the domain of deep learning, where GPUs capabilities provide superior performance over CPUs.

Further research has led to the development of Intelligence Processing Units (IPUs), e.g., Google's Tensor Processing Unit (TPU), which are computing units dedicated to performing artificial intelligence tasks. IPUs have been mainly used in servers located in data centers, which may be effective in some circumstances, but the back-and-forth data transmissions required for updating applications and gathering feedback that constitute part of the machine learning data sets required for training is time-consuming and resource-wasteful. On top of this, IPUs solely implemented in servers do not provide a high level of privacy protection for users, as companies have to store user application data on their servers. Other techniques involve placing a dedicated AI processor on user devices, or combining the capabilities of local AI processing with server-based AI processing to achieve desired levels of security and performance. However, there still is a need for enhancing AI and graphics processing speeds.

Hence, improvements in the field of AI processors that can process large data sets required for machine learning while maintaining a high level of security and which can process the data at high speeds are required.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

One or more problems are solved by embodiments of an electronic chip, a chip assembly, a computing device, and a method, as described herein.

A first aspect of the current disclosure includes a plurality of processing cores and at least one hardware interface coupled to the plurality of processing cores, wherein at least one processing core implements a first engine (e.g., one or more game engines and/or simulation engines) in hardware by dedicated electronic circuitry, wherein at least one of the processing cores implements one or more artificial intelligence engines in hardware by dedicated electronic circuitry, wherein the first engine is coupled to the artificial intelligence engine, and wherein the implementations are on-chip implementations. The hardware interface may be realized as a part of the at least one integrated circuit of the electronic chip. However, the hardware interface may also be realized as one or more further integrated circuits providing the functionality of interfacing the processing cores, including the hardwired first engine and hardwired artificial intelligence engine. The first engine and artificial intelligence engine may be directly coupled on a common processing unit to the chip may user a buffer or memory to exchange data between the game engine and/or simulation engine and artificial intelligence engine.

The verb "implement" as used throughout this application is directed at an implementation in hardware. Hence, a processing core may include a plurality of electronic circuits that are configured to realize functionality of a game and/or simulation engine and a plurality of electronic circuits that are configured to realize functionality of an artificial intelligence engine. The one or more processing cores are a dedicated electronic circuitry implementing or realizing the functionality of a game and/or simulation engine and artificial intelligence engine in hardware. Hence, the game and/or simulation engine may also be referred to as a hardware game and/or simulation engine or as a hardwired game and/or simulation engine or as an on-chip game and/or simulation engine, and likewise, the artificial intelligence engine also be referred to as a hardware artificial intelligence engine, a hardwired artificial intelligence engine, or as an on-chip artificial intelligence engine. Accordingly, the electronic chip may be referred to as an Engine on Chip (EOC) or Engine Processing Unit (EPU). The processing cores may implement the game and/or simulation engine and artificial intelligence engine as a plurality of hardwired electronic circuits implementing respective functionalities of a game and/or simulation engine and of an artificial intelligence engine, which may be arranged or assembled according to any suitable production process. Furthermore, a configured field programmable gate array (FPGA) could be used to implement the game and/or simulation engine, the artificial intelligence engine, or both, in hardware. The electronic chip may be provided as an integrated circuit that integrates all components and functionality of the hardwired game and/or simulation engine and hardwired artificial intelligence engine into a single chip or a plurality of chips.

The processing cores of the electronic chip may be regarded as functional units or modules of the electronic circuits of the electronic chip. For example, at least one of the one or more processing cores may be realized as an FPGA or any other form of an integrating circuit implementing a dedicated functionality. Accordingly, the electronic chip includes at least one integrated circuit realizing at least some of the one or more processing cores, wherein at least one of the processing cores implements the hardwired game and/or simulation engine, and wherein at least one of the processing cores implements the artificial intelligence engine.

The at least one hardware interface enables a direct interaction with the one or more processing cores. The hardware interface may be realized as a part of the at least one integrated circuit of the electronic chip. However, the hardware interface may also be realized as one or more further integrated circuits providing the functionality of interfacing the processing cores, including the hardwired game and/or simulation engine and artificial intelligence engine.

The hardwired game and/or simulation engine is configured to perform one or more tasks on input data thereby generating data sets. Preferably, the hardwired game and/or simulation engine may be implemented on a core that implements hardwired algorithms and code functions, which may be applied to data. This may enable faster graphics or simulation results in 2D, 3D or 4D (3D+time) even for stereo displays. The input data may be input by a user through suitable programming interfaces, captured by one or more external sensory mechanisms communicatively connected to the electronic chip via the at least one hardware interface, or any combination thereof. The sensory mechanisms may include, without limitations, optical sensors, inertial sensors, or combinations thereof. The input data may include one or more of an image data, 3D geometries, video data, audio data, textual data, haptic data, time data, position and orientation data, or any combination thereof.

In further embodiments, the electronic chip may include a memory configured to store data and to provide the data to one or more processing cores. For example, the game and/or simulation engine may store the preprocessed data in the memory and may issue a command to the on-chip artificial intelligence engine to read and further process the data. The artificial intelligence engine may use the memory or a different communication channel to communicate the results to the hardwired game and/or simulation engine. A register or a register set may be used to control properties of the memory, to indicate characteristics of the stored data and/or to control operation of the on-chip artificial intelligence engine. The input data may be stored in the memory, and may thereafter be retrieved by the hardwired game and/or simulation engine for performing one or more tasks thereon to generate data sets. In other embodiments, the data may be stored in an external main memory of the host system, which may be accessible via one or more ports of an on-chip memory controller.

In some embodiments, the one or more tasks performed by the hardwired game and/or simulation engine on the input data may be defined by and reflect the functionality of the game and/or simulation engine. The electronic chip may expose an interface for controlling the game and/or simulation engine according to its functionality. In some embodiments, the one or more tasks may be initiated via the interface of the on-chip game and/or simulation engine. The one or more tasks may be performed in real-time during the programming of a video game or other application, but may also be performed during application run-time (i.e., the actual real-time execution of the application by a user), whereby the game and/or simulation engine may process, in real time, data that may be used to generate data sets for the artificial intelligence engine. In yet another embodiment, the one or more tasks include one or more of determining how objects cast shadows over other objects, determining how objects are reflected in other objects, or determining how the light falling on one object illuminates other surrounding objects. In addition or as an alternative, the game and/or simulation engine may perform other and further tasks, including tasks directed at simulation and/or rendering of graphics scenes, such as a simulation of individual objects of the graphics scene, a determination of characteristics of objects of the graphics scene, rendering of one or more of the objects of the graphics scene, and the like. In addition or as an alternative, the game and/or simulation engine may perform one or more of viewport culling and coverage (z-) buffer culling to determine visibility of objects, voxelization of a scene as a preparation step for global illumination calculations, sparse voxel-based cone tracing for global illumination, muscle fiber mechanics and musculoskeletal skinning, finite element methods for biomechanical muscle modelling, fluid dynamics using SPH (smoothed-particle hydrodynamics) for realistic effects involving water volumes, volcanic lava volumes, and astrophysical effects, which may be related to surfaces of stars, real-time Eulerian water simulation, or realistic vegetation dynamics, and the like, in any combination. In another aspect of the current disclosure, the one or more tasks may include classifying input data into first and second data sets for processing by the artificial intelligence engine.

Performing the one or more tasks on the input data generates data sets that may be stored in the memory and retrieved by the artificial intelligence engine. The data sets may include at least a first data set including contextual data, and a second data set including target data. The term "context" or "contextual data", as used in the current disclosure, refers to data related to the environment of a user employing a computing device including an EPU of the current disclosure. Thus, for example, contextual data may include 3D image data, 3D geometries, 3D entities, 3D sensory data, 3D dynamic objects, video data, audio data, textual data, time data, position and orientation data, lighting data, amongst others, of the environment surrounding a user. The term "target" or "target data", as used in the current disclosure, refers to data related to current user or other entities (e.g., animals, objects, persons, places, etc.) that are prone to be identified through machine learning algorithms by the artificial intelligence engine. Thus, for example, target data may include 3D image data including target faces (e.g., a human or an animal face), 3D geometries, video data, audio data (e.g., the voice of a user of another person of interest), and textual data, amongst others.

Machine learning algorithms may include a training phase and an inference phase. The training of a machine learning algorithm, as well as the inference phase, may involve so-called "tensor operations", or computational operations of multidimensional tensors. A multidimensional tensor refers to a multidimensional array of real numbers. Some tensor operations involved in a machine learning algorithm fall in a category called "tensor contraction", which takes two tensors as input and applies operations such as multiplication and accumulation to the two tensors, resulting in an output tensor. Although these tensor contraction operations may be performed by general purpose CPUs or GPUs, certain characteristics of tensor contraction operations employed for machine learning, such as a consistent data flow, large number of multiplications, and specialized nature of non-multiplication operations, are not suitable to be performed in CPUs and GPUs. This may be especially the case for inference-requiring, autonomous applications that are interfaced to a user and require a real-time, fast processing. Thus, the on-chip, hardwired artificial intelligence engine of the current disclosure may be designed to be specifically tailored for performing such tensor contraction operations for machine learning. More specifically, the hardwired artificial intelligence engine of the current disclosure refers to a semiconductor, hardwired processing core that contains dedicated electronic circuitry for performing operations optimally for tensor operations and other operations specific to machine learning. For example, where a GPU may include hardware specific to quaternion operations, such operations, while related to linear algebra are not typically used in machine learning tensor operations. In contrast, permutations and noise generation are generally not implemented in GPUs, but are commonly used in machine learning.

According to an embodiment, the artificial intelligence engine is configured to perform machine learning algorithms on the data sets retrieved via the memory. The machine learning algorithms may be employed for training of the artificial intelligence engine, and for subsequent inference of new data. The machine learning algorithms may include, without limitations Naïve Bayes Classifiers Algorithms, Nearest Neighbours Algorithms, K Means Clustering Algorithms, Support Vectors Algorithms, Apriori Algorithms, Linear Regression Algorithms, Logistic Regression Algorithms, Neural Network Algorithms, Random Forest Algorithms, and Decision Trees Algorithms, amongst others, in any combination. Furthermore, the machine learning algorithms may combine one or more of a supervised learning, unsupervised learning, and reinforcement learning.

In a preferred embodiment, the artificial intelligence engine performs Neural Network (NN) algorithms on the data sets retrieved by the memory. Some kinds of NN that may be employed include, for example, Multi-Layer Perceptrons (MLP), Convolutional Neural Networks (CNN), and Recurrent Neural Networks (RNN).

The present disclosure thus provides a support for efficient, real-time, highly realistic rendering by implementing a game and/or simulation engine in hardware along with accelerated processing of tensor contraction operations used during machine learning and inferring for data recognition and other autonomous tasks. The electronic chip of the current disclosure may be suitable for use in applications requiring a high degree and speed of data processing and recognition, especially 3D applications that may be used for drones, autonomous driving, robotics, machine and computer vision, personal assistants, video games, etc. The electronic chip may be used to support a CPU of a host system, such as a console, mobile device, or head-mounted displays, by providing dedicated 3D graphics hardware and dedicated artificial intelligence training and inference hardware. However, since the hardware implements a game and/or simulation engine and an artificial intelligence engine, control of the hardware may be simplified since interfaces of the game and/or simulation engine and of the artificial intelligence engine may be used. Hence, an average graphics programmer that needs to write high-performance and highly realistic applications may use the hardwired game and/or simulation engine and artificial intelligence engine, which maintains a simple interface while providing the programmer with highly realistic real-time rendering and machine learning and inference options.

Moreover, employing contextual data in combination with target data of the current disclosure may enhance speed of recognition tasks performed by the artificial intelligence engine through machine learning algorithms, since the contextual data may provide an extra layer of information to the artificial intelligence engine. This extra layer of information may be used during training and inference of data to increase the probabilities of recognizing a specific target depending on the context where the target is located, which may enhance computing speeds and may reduce required computing power by any of the one or more processing cores. For example, if an individual target is found in a majority of situations in a specific place, using the contextual data, the artificial intelligence engine may reduce the probabilities of finding the individual target in another location, thus increasing the probabilities of finding the individual in the "usual" locations, reducing the computing power and the time required to perform the necessary processing. In addition, since the processing is done directly through the EPU including the coupled hardwired game and/or simulation engine and hardwired artificial intelligence engine, processing times may be accelerated because the coupled hardwired game and/or simulation engine and hardwired artificial intelligence engine process native data from the software game and/or simulation engine and software artificial intelligence engine without necessarily requiring data transmission and processing to CPUs or GPUs. In addition, coupling the game and/or simulation engine directly to the artificial intelligence engine, the data exchange speed and throughput can be greatly improved and optimized since data exchange can be carried out via short data links and no complex data exchange protocol needs to be implemented.

According to an embodiment, antennas may be configured to transmit and receive radio waves that enable mobile communication with the EPU. Antennas may be connected through wired or wireless means to compute centers. In other embodiments, the antennas are provided within the compute centers and/or areas services by compute centers. In some embodiments, in order to service host systems located outdoors, the antennas may include millimeter wave (mmW)-based antenna systems or a combination of mmW-based antennas and sub 6 GHz antenna systems. In other embodiments, the antennas may include other types of antennas, such as 4G antennas, or may be used as support antennas for the mmW/sub GHz antenna systems. In embodiments where antennas used for servicing host systems located indoors, the antennas may use wireless local area networking (WiFi), preferably, but not limited to, providing data at 16 GHz.

According to an embodiment, the on-chip game and/or simulation engine includes a dedicated on-chip artificial intelligence engine implemented by dedicated electronic circuitry on at least one common processing core, herein referred to as an engine core. The engine core may provide functionality in hardware of a game and/or simulation engine and of an artificial intelligence engine. Providing the game and/or simulation engine and artificial intelligence engine on a single, common hardware processing core may reduce processing times by enabling fast communication via short data links. Additionally, implementing an artificial intelligence engine dedicated to a single game and/or simulation engine may improve efficiency because the artificial intelligence engine may only need to process data sent by the game and/or simulation engine to which it is dedicated.

According to an embodiment, the game and/or simulation engine may be separated into individual, dedicated hard-wired components comprising a 3D structures processor, a physics processor, a communications unit, and an optional rendering engine, each implemented in hardware by dedicated circuitry in a common engine core along with an artificial intelligence engine. The 3D structures processor may be configured to perform 3D data algorithms in order to determine a faithful approximation of a given surface's geometry and processing of images into suitable data structures (e.g., octrees, quadtrees, BSP trees, sparse voxel octrees, 3D arrays, and k-d trees). The physics processor may perform algorithms that provide an approximate simulation of certain physical systems, such as rigid body dynamics (including collision detection and crowd steering), soft body dynamics, mass particle dynamics, and fluid dynamics. The communications unit may include one or more dedicated transceivers to receive and send communication signals from and to antennas, Wi-Fi, or combinations thereof. Preferably, the one or more dedicated transceivers are millimeter-wave (mmW) transceivers. The rendering engine may perform rendering algorithms on data in order to synthesize images to generate photorealistic 3D models.

According to an embodiment, the common engine core comprises 3D structures processor, an artificial intelligence engine, a simulation engine, a communications unit, a position engine, and a rendering engine, each implemented in hardware by dedicated circuitry. A chip comprising the common engine core may act as a position-based game and/or simulation engine and artificial intelligence engine, providing an accurate position and orientation that may drive a plurality of applications. In some embodiments, the 3D structures processor requests the position and orientation of a respective client device implementing a chip comprising the common engine core to the position engine, in order to increase the accuracy of the position and orientation of the client device with respect to other elements around a user. In some embodiments, the position engine may, upon receiving a position and orientation request from the 3D structures processor, request and receive global satellite navigation system (GNSS) radio signals, which refers collectively to multiple satellite-based navigation systems like GPS, BDS, Glonass, Galileo, QZSS, and IRNSS, and thereby through techniques such as triangulation or trilateration, perform hardware-based algorithms to calculate position of respective client devices. In other embodiments, the position engine may further communicate to the communications unit and obtain further position data of respective client devices through cellular network positioning techniques using 4G antennas, mmW or cmW antennas (e.g., through 5G networks), or combinations thereof, by employing antenna triangulation methods such as TOA and AOA; may utilize indoor tracking techniques such as WiFi; or may utilize other tracking techniques known in the art. In other embodiments, the position engine may further obtain position-and-orientation-related sensory data from one or more sensory mechanisms connected to the chip via the hardware interface, such as one or more Inertia Measuring Unit (IMU), accelerometers, gyroscopes, cameras, eye-tracking sensors, and the like. In other embodiments, the position engine may further request and obtain position-and-orientation data of respective client devices from the 3D structures processor, whereby the 3D structure of entities around a user and the 3D structure of a user (e.g., the 3D structure of a 3D user avatar) can provide the position engine with further information to calculate the position and orientation of the respective client device. In other embodiments, the position engine can calculate the position and orientation of respective client devices by combining methods described above.

In some embodiments, the simulation engine comprises dedicated hardware circuitry configured to implement algorithms for simulating the behavior, functions and abstract or physical properties of real-world objects into virtual replicas in a virtual world, and to predict such characteristics. The simulation engine may obtain a plurality of data related to each real-world object through various methods, such as by inputting data sets through a virtual replica editor that may be part of a computer aided drawing (CAD) software or other similar system, by inputting sensory data of each of the real-world objects that can serve to enrich and/or complement the input data, or by using combinations thereof. For example, the real-world object data may be obtained by inputting a building information model (BIM), which provides a plurality of features related to the appearance and operations of a building. In another example, the real-world object data may be obtained by inputting the virtual model of a car providing a plurality of features related to the appearance and operations of the car. In another example, radar-imaging, such as synthetic-aperture radars, real-aperture radars, AVTIS radars, Light Detection and Ranging (LIDAR), inverse aperture radars, monopulse radars, and other types of imaging techniques may be used to map and model real world entities before integrating them into the virtual world.

The simulation engine may further obtain a client device position and orientation data from the position engine in order to simulate said position and orientation data into the virtual replica, or to further predict the position and orientation of the client device. By way of example, the simulation engine may be used in a chip implemented in a self-driving vehicle or drone in order to predict their immediate path. The prediction may be performed by obtaining the current position, orientation, speed and acceleration of the self-driving vehicle or drone and using these data to interpolate their immediate path.

In some embodiments, the communications unit includes hardware configured to receive wireless radio waves from antennas and to send the data back to the antennas, which may as well be used for enabling an accurate tracking of the host system. In some embodiments, mmW transceivers may be employed, which may be configured to receive mmW wave signals from antennas and to send the data back to antennas. In some embodiments, tracking may be performed employing several techniques known in the art, such as time of arrival (TOA), angle of arrival (AOA), or other tracking techniques known in the art (e.g., visual imaging, radar technology, etc.).

In another embodiment, the communications unit implements, in hardware, a distributed ledger-based communications pipeline between users of a host device including an electronic chip according to embodiments of the current disclosure. The distributed ledger-based communications pipeline may enable direct communication between users through a decentralized network by allowing storage of information in a secure and accurate manner using cryptography, employing cryptographic "keys" and cryptographic signatures. Once the information is stored, the data becomes an immutable database and is governed by rules of the network.

In yet another embodiment, a plurality of the processing cores implement a plurality of game and/or simulation engines and a plurality of artificial intelligence engines, wherein each of the plurality of game and/or simulation engines is associated with a single one or at least one of the plurality of artificial intelligence engines.

In an alternative embodiment, at least one of the processing cores implements a central processing unit. Hence, the at least one processing core may be an electronic circuitry that carries out instructions of a computer program by performing basic arithmetic, logical, control and input/output (I/O) operations. The functionality of the central processing unit may be the same or similar to that of existing CPUs. The central processing unit may allow an execution of software according to an instruction set architecture directly on the electronic chip. The software may be dedicated to processing of the game and/or simulation engine and artificial intelligence engine. However, it is to be understood that the central processing unit is not restrictive to processing of the game and/or simulation engine and artificial intelligence engine only but may, rather, execute any kind of software which may exploit the functionality of the electronic chip. The electronic circuitry may include at least one respective microcontroller, microprocessor or digital signal processor (DSP) on the single electronic chip in any combination. In order to enable operation of the central processing unit, the electronic chip may further comprise memory blocks, such as a selection of ROM, RAM, EEPROM and/or flash memory, timing sources including oscillators and phase-locked loops, peripherals including counter timers, real-time timers and power-on reset generators, external interfaces, such as USB, Firewire, Ethernet, SPI, and the like, analog interfaces including ADCs and DACs, voltage regulators and power management circuits on the electronic chip, in any combination. Some of these components may form part of the electronic circuitry realizing the at least one processing core implementing the central processing unit while others may be separate and dedicated components of the electronic chip that are realized by one or more electronic circuits implementing the desired functionality. The game and/or simulation engine and artificial intelligence engine may be directly coupled to the central processing unit and/or may utilize a buffer or memory to exchange data between the central processing unit and the game and/or simulation engine. The central processing unit may also include further interfaces to directly couple to the hardwired game and/or simulation engine and hardwired artificial intelligence engine. By coupling the game and/or simulation engine and artificial intelligence engine to the central processing unit using dedicated data links and/or buffers, the data exchange speed and throughput can be greatly improved and optimized since data exchange can be carried out via short data links and no complex data exchange protocols need to be implemented.

In a further embodiment, a plurality of the processing cores implement a plurality of central processing units, each central processing unit being configured to execute instructions of a different instruction set architecture. Hence, the electronic chip may execute software on the individual central processing units, which may be compiled for different systems, including but not limited to Intel's x86 architecture as commonly used in personal computer systems, and systems based on the ARM instruction set, which is typically used in mobile phones and tablets. Hence, the electronic chip may be used in a heterogeneous environment providing a unified access to a well-defined game and/or simulation engine interface for a broad range of software, without requiring an adaptation of the software to a particular instruction set architecture.

According to an embodiment, an instruction set architecture that may be suitable for use by software employed by the EPU includes an extendable instruction set computer (EISC) architecture, which may be designed specifically to perform high-level operations required by the on-chip game and/or simulation engine and on-chip artificial intelligence. In other embodiments, instruction set architectures such as the complex instruction set architecture (CISC), the reduced instruction set architecture (RISC), or other suitable instruction set architectures known in the art may be used by software employed by the EPU.

In another alternative embodiment, the game and/or simulation engine and artificial intelligence engine are configured to communicate data via the hardware interface with an external GPU. The game and/or simulation engine and artificial intelligence engine may receive data from an external entity, such as a CPU or GPU, via the at least one hardware interface. The game and/or simulation engine and artificial intelligence engine may send processed data via the hardware interface to the external entity or another external entity. Preferably, the hardware interface may be a bus interface or an external interface. The processed data may be supplied to the external GPU for further processing and/or rendering on a target display, or for providing complementary machine learning algorithm processing.

In yet another alternative embodiment, at least one of the processing cores implements a graphics processing unit (GPU) (in hardware). Hence, the GPU can be regarded as a hardwired graphics processing unit on the electronic chip. The at least one hardware interface may include a media interface, such as HDMI and the like, which may provide data rendered by the on-chip graphics processing unit to a display or screen. However, it is to be understood that the graphics processing unit may also interface, via the hardware interface, with a bus or other interconnect of a host system to provide the rendered data for display.

In yet another embodiment, the game and/or simulation engine and artificial intelligence engine are configured to generate data for the GPU. The game and/or simulation engine and artificial intelligence engine may pre-process input data that may be suitable for processing on the specialized hardware of the GPU, which may include SIMD processing or vector processing as is known in the art. The preprocessed data may be provided to the on-chip GPU, which may further process the data and/or generate a final rendering of the graphics scene based on the preprocessed data or for providing complementary machine learning algorithm processing. The graphics processing unit may also provide the results to the game and/or simulation engine and artificial intelligence engine for further processing. Hence, the game and/or simulation engine and artificial intelligence engine may prepare data or data sets and offload specific tasks to the GPU in order to exploit the GPU functionality or the specialized hardware of the GPU.

In some embodiments, the game and/or simulation engine and artificial intelligence engine may store the preprocessed data in the memory and may issue a command to the on-chip GPU to read and further process the data. The on-chip graphics processing unit may use the memory or a different communication channel to communicate the results to the hardwired game and/or simulation engine and/or artificial intelligence engine. A register or a register set may be used to control properties of the memory, to indicate characteristics of the stored data and/or to control operation of the on-chip GPU.

In yet another embodiment, the graphics processing unit is connected to a video memory and the game and/or simulation engine and artificial intelligence engine are configured to provide data to the GPU via the video memory. The on-chip GPU may be connected to a dedicated video memory, which may be used internally by the graphics processing unit to load, store or buffer data during processing of the graphics processing unit. The video memory may be located on an interposer as a stack of memory chips. The video memory may be further coupled, for example, via the at least one hardware interface, to the at least one processing core implementing the game and/or simulation engine or to the at least one processing core implement the artificial intelligence engine, thereby enabling the game and/or simulation engine and artificial intelligence engine to directly load and store data to the video memory. This may further improve speed and throughput of data exchange between the hardwired game and/or simulation engine, the artificial intelligence engine, and the on-chip GPU without departing from a standard design of the GPU, which may simplify the design and fabrication of the chip.

In another embodiment, the electronic chip may include a further video encoder and decoder and a display. The video encoder and decoder may perform various dedicated functionality directed at encoding and decoding of video sequences. The display may either be a display configured to display at least some of the output of the one or more processing cores (e.g., game and/or simulation engine, artificial intelligence engine, or the optional GPU) or may be configured to display a state of the chip, by, for example, using a plurality of status indicators. Furthermore, the display may also be configured as an interface to provide data to an external display.

According to an embodiment, the at least one hardware interface is enabled to provide data for individual components of the chip, such as the game and/or simulation engine, artificial intelligence engine, the GPU, the CPU, the video encoder and decoder, and/or to output data generated by the individual components, such as data generated by the game and/or simulation engine, the artificial intelligence engine, the GPU or the CPU. The hardware interface may be configured to comply with one or more standards, such as USB, HDMI and the like.

According to a further aspect, a chip assembly is provided that comprises at least one chip according to embodiments of the present disclosure. The chip may preferably comprise one or more processing cores and at least one hardware interface coupled to at least one of the one or more processing cores, wherein at least one of the one or more processing cores implements a game and/or simulation engine and wherein at least one of the processing cores implements an artificial intelligence engine. The chip assembly may comprise a silicon interposer or carrier, board or substrate to mount the at least one chip and other components of the chip assembly.

As used throughout this disclosure, a chip can be regarded as a layer of transistors, which may further comprise a plurality of layers of metal interconnects on top of the layer of transistors. The layer of transistors may be difficult to produce, in particular for very small transistors. Furthermore, a first layer of the metal interconnect, which may include very fine metal wires, may also be hard to produce. A skilled person may understand that a majority of failures may occur in the production of these layers. The upper layers may have thicker wires and are, in comparison, easier to produce and seldom cause production failures. Hence, they may be used to connect major areas of the chip together.

A (silicon) interposer as used throughout this disclosure may be a generally very large chip with only upper layers of interconnects that may use thicker wires. Hence, the (silicon) interposer can be designed and produced cheaper with existing chip fabrication equipment. Although the wires may be relatively thick, a (silicon) interposer may include tens of thousands of wires.

A chip assembly as used throughout this disclosure may refer to a combination of a plurality of (sub-)chips on one silicon interposer. Hence, a chip assembly may be functionally equivalent to a single chip that may be very big. This is particularly advantageous if during production or fabrication, a single chip would become very big and therefore too costly to produce, for example due to higher defect rates. Accordingly, the design of the single chip could be subdivided into multiple separate (sub-)chips, which can be smaller. The smaller chips can be tested first and those that pass the test can then be connected together on a silicon interposer in the chip assembly. Furthermore, a whole range of designs can be made of different sizes, at little extra cost, by placing several equal small chips on an appropriately sized silicon interposer. Accordingly, the at least one chip of the chip assembly according to embodiments of the present disclosure may be subdivided into multiple separate smaller (sub-)chips that are connected together on the silicon interposer or carrier of the chip assembly.

A silicon interposer can be used to establish tens of thousands of connections between multiple chips on the chip assembly. It is to be understood that the silicon interposer may establish significantly more interconnects than provided by a carrier, board or substrate to mount the at least one chip. A silicon interposer may cover an entire area of all (sub-)chips that are interconnected by the silicon interposer.

In yet another embodiment, a chip assembly may be interconnected using micro-bridges comprising the interconnect layers. Micro-bridges may only cover edges of adjacent (sub-)chips providing the interconnections between these adjacent (sub-)chips.

In one embodiment, the chip assembly may further comprise at least one central processing unit, wherein the central processing unit is connected to the hardware interface of the chip. The central processing unit may be connected to the hardware interface via a bus or any other suitable interface or interconnect of the chip assembly.

In yet another embodiment, the chip assembly may further comprise at least one graphics processing unit, wherein the at least one graphics processing unit is connected to the hardware interface of the chip.

In yet another embodiment, the chip assembly further comprises a memory controller configured to exchange data with the game and/or simulation engine and the artificial intelligence engine of the chip.

Hence, the chip assembly may integrate the electronic chip implementing the hardwired game and/or simulation engine and artificial intelligence game and/or simulation engine and may further include one or more dedicated components, including a central processing unit, a graphics processing unit and/or a memory controller that may form part of the chip assembly but which may be off-chip with regard to the chip implementing the hardwired game and/or simulation engine and artificial intelligence engine. These components may be, however, distinct from components of a host system and components of the electronic chip implementing the hardwired game and/or simulation engine and artificial intelligence engine, such as on-chip central processing unit(s), on-chip GPU(s) and/or an on-chip memory controller. By using an off-chip implementation and integration of these components in the chip assembly, standard components for the central processing unit, the GPU and the memory controller may be used, which may simplify design, processing and fabrication of the chip assembly and reduce respective costs. The chip assembly and its components may be arranged on a carrier, board or substrate that may include an interconnect for the individual components of the chip assembly.

In one embodiment, the chip assembly may include a plurality of stacked integrated circuits, wherein an integrated circuit is stacked on top of another integrated circuit or on an interposer chip. The (vertically) stacked integrated circuits may be connected by Through Silicon Vias (TSV). TSVs are vertical electrical connections passing through a silicon wafer or die. Alternatively the (vertically) stacked integrated circuits may be connected using inductive coupling technology to enable near field wireless communication between the (vertically) stacked integrated circuits. The integrated circuits may realize or implement in hardware one or more of the electronic chip, including the one or more processing cores implementing the hardwired game and/or simulation engine, the artificial intelligence engine, the central processing unit, the graphics processing unit, the memory controller and further components and interfaces of the chip assembly, in any combination. A stacked design may be regarded as a variation of the interposer.

It should be noted that the use of the term silicon in "Silicon Interposer" or "Through Silicon Via" merely stems from the fact that silicon is a dominant material used as a wafer substrate in chip production. However, it is to be understood that embodiments of the present disclosure are not restricted to a particular material. Other materials suitable for application in embodiments of the present disclosure include Germanium, Gallium Arsenide, Indium Arsenide, and the like, in any combination. Accordingly, a respective interposer or through via may be used in corresponding embodiments.

In one embodiment, the chip assembly may be included in a package. Preferably, the chip assembly can be included in a graphics processor package or a game and/or simulation engine processor package. Preferably, the chip assembly may be included in a system in package (SiP) or a package on package. The package including the chip assembly may be easily integrated into a great variety of target environments in order to enable a high performance and realistic rendering of computer graphics along with highly efficient and accurate machine learning processing.

In a system in package (SiP), a number of integrated circuits may be enclosed in a single module (package). The SiP performs all or most of the functions of an electronic system, and may be used for mobile phones, digital media players, and the like. Dies containing the integrated circuits may be stacked vertically on a substrate, carrier or board. They may be internally connected by wires that may be bonded to the package. Alternatively, a flip chip technology may be applied, where solder bumps are used to join stacked chips together. SiP dies can be stacked vertically or tiled horizontally to produce a dense multi-chip package. SiP can connect the dies with standard off-chip wire bonds or solder bumps, or may at least partially use a technology similar to three-dimensional integrated circuits which connect stacked silicon dies with conductors running through the die. The SiP can include one or more of specialized processors, DRAM, flash memory, and other active components, which may be combined with passive components, such as resistors and capacitors that may be all mounted on the same board, carrier or substrate. The SiP represents a complete functional unit that can be built in a multi-chip package without further external components. This is advantageous in space-constrained environments, like mobile devices or head-mounted displays. The complexity of the printed circuit board and overall design may thus be greatly reduced.

According to an embodiment, a system according to the current disclosure may include a CPU coprocessor together with an engine coprocessor. The game and/or simulation engine coprocessor can be understood as a separate chip, optionally with its own package, which may be connected to the CPU via an interface bus, such as a PCI express bus, or any other bus interface or interconnect. The system including a CPU coprocessor together with an engine coprocessor may be used, for example, in a server, and may be configured to support edge-processing (i.e., processing performed by client devices, such as mobile phones or head-mounted displays). However, it may be understood that the system including a CPU together with an engine coprocessor may also be employed in a client device. The engine coprocessor may include one or more chips incorporating one or more hardwired game and/or simulation engines and one or more artificial intelligence engines. The engine coprocessor may further comprise a memory controller and a hardware interface to communicate with the CPU. The CPU may include one or more CPU cores, a memory controller, and a hardware interface. In other embodiments, the engine coprocessor may include an engine core implementing a 3D structures processor, an artificial intelligence engine, a physics processor, a communications unit, and a rendering engine, whereby implementations are in hardware by dedicated electronic circuitry. In other embodiments, no rendering engine is included in the engine core of the game and/or simulation engine coprocessor. The CPU may issue commands to the engine coprocessor which may then prepare data sets and commands that can be communicated back to the CPU. A higher performance can be reached by offloading CPU tasks to the game and/or simulation engine coprocessor. The dedicated memory controller on the engine coprocessor may allow the engine coprocessor to use its local memory to perform specific game and/or simulation engine and machine learning tasks. This may advantageously improve performance by increasing I/O speed and bandwidth.

According to yet another aspect, a computing device is provided, which includes at least one chip or chip assembly according to embodiments of the current disclosure, a host CPU and GPU, a power source, a memory, and I/O module, and sensing mechanisms. The chip or chip assembly may thus be used to support the host CPU and GPU by performing game and/or simulation engine tasks and machine learning algorithms as disclosed. The computing device may be a mobile device, a head-mounted display, a personal computer, a game console, a server computer, and the like.

According to an embodiment, a method for accelerated graphics processing and machine learning algorithm computations is provided. The method includes providing, on a computing device, at least one electronic chip including at least a hardware interface, and one or more processing cores including one or more game and/or simulation engines and one or more coupled artificial intelligence engines; providing a memory or memory controller communicatively connected to an external memory; obtaining input data, and transferring the data to the game and/or simulation engine via the memory; performing, by the game and/or simulation engine, one or more tasks on the sensory data in order to generate at least a first and a second data set, and transferring the data sets to the artificial intelligence engine via the memory; applying, by the artificial intelligence engine, machine learning algorithms on the data sets; checking whether there is more input data, in which case the method may loop back to obtaining the new input data, and, in negative case, the method may end.

According to yet another aspect, a computer-readable medium is provided, wherein the computer-readable medium stores instructions thereon that, when installed on and executed by a computing device, cause the computing device to perform a method according to embodiments of the present disclosure. Preferably, the method may include a fabrication of an electronic chip and/or an operation of the electronic chip according to embodiments of the present disclosure.

BRIEF DESCRIPTION OF THE DRAWINGS

Specific features, aspects and advantages of the present disclosure will be better understood with regard to the following description and accompanying drawings, where.

DETAILED DESCRIPTION

In the following description, reference is made to drawings which show by way of illustration various embodiments. Also, various embodiments will be described below by referring to several examples. It is to be understood that the embodiments may include changes in design and structure without departing from the scope of the claimed subject matter.

FIGS. 1A-1E illustrate schematic views of an electronic chip according to an embodiment of the present disclosure. The electronic chip may include a plurality of hardwired game and/or simulation engines and a plurality of artificial intelligence engines that may be physically incorporated on the chip, which may, therefore, represent a system on a chip (SOC). Accordingly, the electronic chip throughout this disclosure may be referred to as an EOC or Engine Processing Unit (EPU).

Figure 1A:
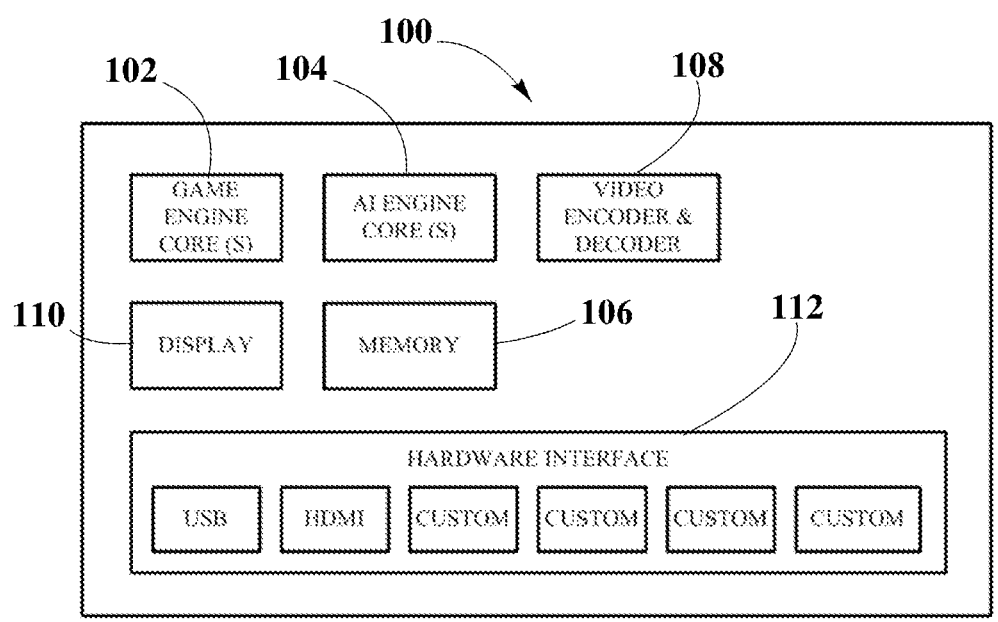
FIGS. 1A-1E illustrate schematic views of an electronic chip including one or more hardwired game and/or simulation engines and one or more artificial intelligence engines, according to an embodiment.

As viewed in FIG. 1A, the chip 100 may include a plurality of processing cores, each implementing in hardware by dedicated electronic circuitry a (hardwired) game and/or simulation engine 102 and an artificial intelligence (AI) engine 104. Even though each processing core is shown as implementing in hardware a dedicated component, it is to be understood that a plurality of processing cores may implement one component, or that one processing core may implement a plurality of components, such as the game and/or simulation engine 102 and the AI engine 104, in any combination. The chip 100 may comprise a plurality of game and/or simulation engines 102 and a plurality of AI engines 104.

The chip 100 may be embodied as a game and/or simulation engine processor with enhanced graphics and machine learning processing capabilities, and may be realized in hardware as a game and/or simulation engine processor chip or a game and/or simulation engine processor package, where the package may contain a single or a plurality of integrated circuits implementing in hardware the functionality of the individual components. The hardwired game and/or simulation engine 102 may be incorporated into a hardware component, such as a chip 100 that may be a stand-alone game and/or simulation engine processor chip or a game and/or simulation engine processor package. The game and/or simulation processor with enhanced machine learning processing capabilities may be particularly useful in the case of high-end 3D graphics or gaming computers, but may also be very useful in other 3D applications that require image or sound recognition, fast behavioral learning and autonomous decision-making. These computer systems typically contain separate host CPUs together with separate 3D graphics cards with one or more GPUs performing graphics processing and machine learning processing. The standalone game and/or simulation engine processor could, for instance, be placed in a 3D graphics card together with one or more GPUs, but is not so limited.

The chip 100 may be included in a host system (not shown) as a SOC. The hardwired game and/or simulation engine 102 can directly process specifically constructed data sets located in a memory 106. As shown in FIG. 1A, the memory 106 may be located in a specifically designated area of the chip 100. However, the memory may also refer to an external memory of the host system, which may be accessible via one or more ports of an on-chip memory controller (not shown). The game and/or simulation engine 102 may store the preprocessed data in the memory 106 and may issue a command to the on-chip artificial intelligence engine 104 to read and further process the data. The artificial intelligence engine 104 may use the memory 106 or a different communication channel to communicate the results to the hardwired game and/or simulation engine 102. A register or a register set may be used to control properties of the memory 106, to indicate characteristics of the stored data and/or to control operation of the on-chip artificial intelligence engine 104.

In further embodiment, the electronic chip 100 may include a further video encoder and decoder 108, a display 110, and a hardware interface 112. The video encoder and decoder 108 may perform various dedicated functionality directed at encoding and decoding of video sequences. The display 110 may either be a display configured to display at least some of the output of the one or more processing cores or may be configured to display a state of the chip 100, by, for example, using a plurality of status indicators. Furthermore, the display 110 may also be configured as an interface to provide data to an external display. The hardware interface 112 may comprise or represent one or more interfaces, which may be configured to provide data for individual components of the chip 100. For example, the hardware interface 112 may be able to connect to one or more sensory mechanisms. The hardware interface 112 may be configured to comply with one or more standards, such as USB, HDMI and the like.

The AI engines 104 may be assigned to individual game and/or simulation engines 102 according to a workload of the game and/or simulation engines 102 or according to a predefined assignment. The assignment may be controlled by the game and/or simulation engines 102 in accordance with internal conditions or responsive to commands received via the hardware interface 112 of the chip 100.

Data obtained by the game and/or simulation engine 102 may be directly input by one or more users on the host system via the hardware interface 112 of the game and/or simulation engine 102 or may be obtained by sensory mechanisms. Users may include, in some embodiments, human users or artificial intelligence users. For example, during the programming of an application, a user may include a programmer developing an application through a programming interface of the game and/or simulation engine 102, and thus the input data may be input accordingly through the programming interface. The programmer may also input data through sensory mechanisms which may not involve input of data through programming interfaces. However, artificial intelligence agents may also be used for testing or even programming the application and thus may as well input data. In another example, during execution of an application, a user of the game and/or simulation engine 102 may include a final user of the application. The sensory data captured by the sensory mechanisms may include one or more of an image data, 3D geometries, video data, audio data, textual data, haptic data, time data, position and orientation data, or a combination thereof.

In some embodiments, the one or more tasks performed by the game and/or simulation engine 102 on the input data may be defined by and reflect the functionality of the game and/or simulation engine 102. The electronic chip 100 may expose an interface for controlling the game and/or simulation engine 102 according to its functionality. In some embodiments, the one or more tasks may be initiated via the interface of the on-chip game and/or simulation engine 102. The one or more tasks may be performed in real-time during the programming of a video game or other application, but may also be performed during application run-time (i.e., the actual real-time execution of the application by a user), whereby the game and/or simulation engine 102 may process, in real time, sensory data that may be used to generate data sets for the artificial intelligence engine 104 in addition to data input by a final user through an I/O module of the host system. By way of example, the hardwired game and/or simulation engine 102 may be able to determine how objects cast shadows over other objects of a computer graphics scene, how objects are reflected in other objects or how the light falling on one object illuminates other surrounding objects. However, it is to be understood that the game and/or simulation engine 102 may be configured to perform other tasks and/or may provide other functionality, such as management, simulation and rendering of the objects of the computer graphics scene. In another aspect of the current disclosure, the one or more tasks may include classifying input data into first and second data sets.

Performing the one or more tasks on the input data generates data sets that may be stored in the memory 106 and retrieved by the artificial intelligence engine 104. The data sets may include at least a first data set including contextual data, and a second data set including target data. Contextual data may include 3D image data, 3D geometries, 3D entities, 3D sensory data, 3D dynamic objects, video data, audio data, textual data, time data, position and orientation data, lighting data, amongst others, of the environment surrounding a host device including one or more chips 100. Target data may include 3D image data including target faces (e.g., a human or an animal face), 3D geometries, video data, audio data (e.g., the voice of a user of another person of interest), and textual data, amongst others.

According to an embodiment, the artificial intelligence engine 104 is configured to perform machine learning algorithms on the data sets retrieved via the memory 106. The machine learning algorithms may be employed for training of the artificial intelligence engine 104, and for subsequent inference of new data. Performing machine learning algorithms on contextual data in combination with target data of the current disclosure may enhance speed of recognition tasks performed by the artificial intelligence engine 104, since the contextual data may provide an extra layer of information to the artificial intelligence engine 104. This extra layer of information may be used during training and inference of data to increase the probabilities of locating a specific target depending on the context where the target is located, which may enhance computing speeds and may reduce required computing power by any of the one or more processing cores. Since the processing is done directly through the electronic chip 100 by the coupled hardwired game and/or simulation engine 102 and hardwired artificial intelligence engine 104, processing times may be accelerated because the coupled hardwired game and/or simulation engine 102 and hardwired artificial intelligence engine 104 process native data from the software game and/or simulation engine 102 and software artificial intelligence engine 104 without necessarily requiring data transmission and processing to CPUs or GPUs.

The present disclosure thus provides a support for efficient, real-time, highly realistic rendering by implementing a game and/or simulation engine 102 in hardware along with accelerated processing of tensor contraction operations used during machine learning and inferring for data recognition and other autonomous tasks. Therefore, the electronic chip of the current disclosure may be suitable for use in applications requiring a high degree and speed of data processing and recognition, in particular 3D applications that may be used for drones, autonomous driving, robotics, machine and computer vision, personal assistants, video games, etc.

According to an embodiment, antennas (not shown) may be configured to transmit and receive radio waves that enable mobile communication with the chip 100. Antennas may be connected through wired or wireless means to compute centers. In other embodiments, the antennas are provided within the compute centers and/or areas services by compute centers. In some embodiments, in order to service host systems located outdoors, the antennas may include millimeter wave (mmW)-based antenna systems or a combination of mmW-based antennas and sub 6 GHz antenna systems. In other embodiments, the antennas may include other types of antennas, such as 4G antennas, or may be used as support antennas for the mmW/sub GHz antenna systems. In embodiments where antennas used for servicing host systems located indoors, the antennas may use wireless local area networking (WiFi), preferably, but not limited to, providing data at 16 GHz.

FIGS. 1B-1E may include similar elements as those of FIG. 1A, and may therefore contain the same or similar reference numbers.

Figure 1B:
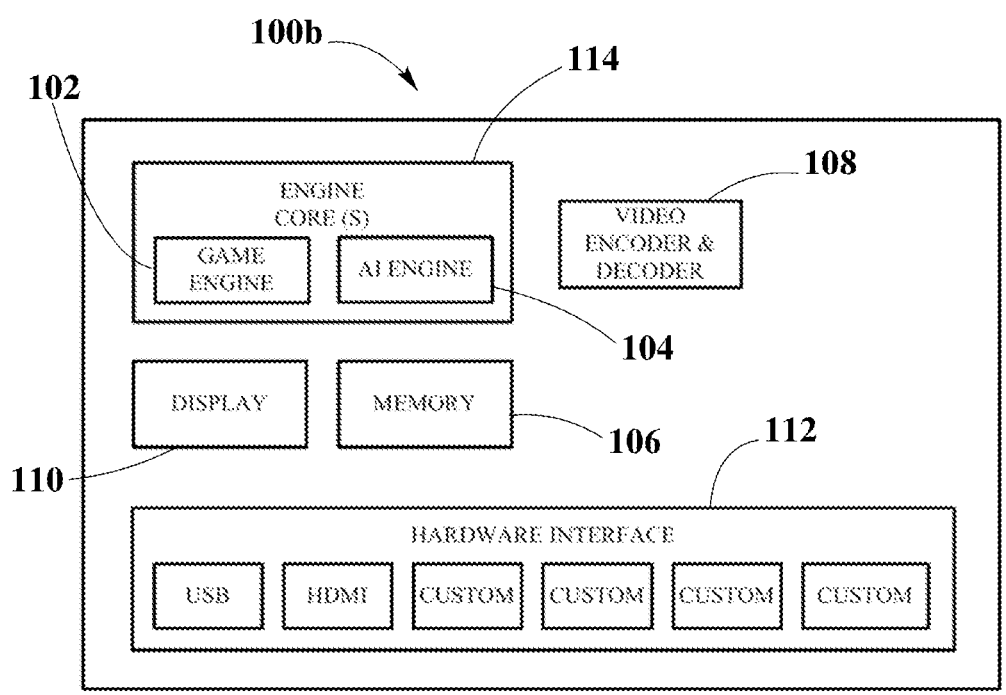

FIG. 1B depicts an embodiment where a chip 100b implements a game and/or simulation engine 102 with a dedicated artificial intelligence engine 104, whereby implementations are performed by dedicated electronic circuitry on at least one common processing core, or engine core 114. Providing the game and/or simulation engine 102 and artificial intelligence engine 104 on a single, common hardware processing core may reduce processing times by enabling fast communication via short data links. Additionally, implementing an artificial intelligence engine 104 dedicated to a single game and/or simulation engine 102 may improve efficiency because the artificial intelligence engine 104 may only need to process data from the game and/or simulation engine 102 to which the artificial intelligence engine 104 is dedicated. Additional functions of each of the game and/or simulation engine 102 and artificial intelligence engine 104 of chip 100b may be similar to the functions in the description with reference to FIG. 1A. The chip 100b may additionally include a memory 106 or memory controller (not shown), a video encoder and decoder 108, a display 110, and a hardware interface 112 configured to have a functionality similar to that described with reference to FIG. 1A.

Figure 1C:
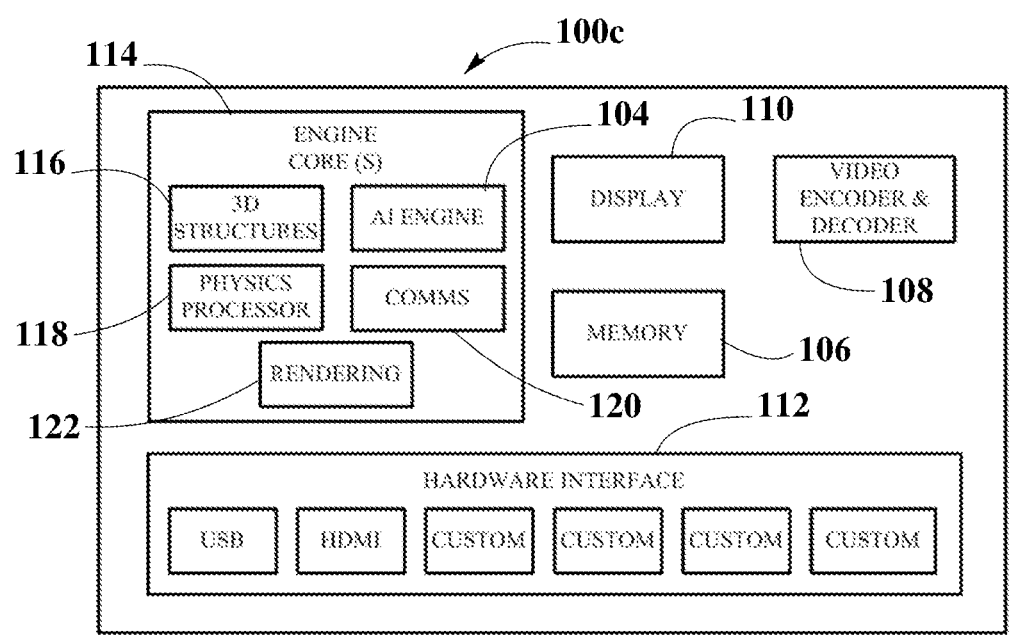

FIG. 1C depicts an embodiment of a chip 100c wherein the game and/or simulation engine 102 has been separated into individual, dedicated hardwired components comprising a 3D structures processor 116, a physics processor 118, a communications unit 120, and a rendering engine 122, each implemented in hardware by dedicated circuitry in a common engine core 114 along with an artificial intelligence engine 104. By implementing dedicated circuitry for each of the individual 3D structures processor 116, artificial intelligence engine 104, physics processor 118, communications unit 120, and rendering engine 122 on a single engine core 114, functionality of each of these components is enhanced because of being assigned dedicated hardware for their specific function. This may result in an engine core 114 providing enhanced functionalities of a game and/or simulation engine with accelerated artificial intelligence processing. The chip 100c may additionally include a memory 106 or memory controller (not shown), a video encoder and decoder 108, a display 110, and a hardware interface 112 configured to have a functionality similar to that described with reference to FIG. 1A.

The 3D structures processor 116 may be configured to perform 3D data algorithms in order to determine a faithful approximation of a given surface's geometry and processing of images into suitable data structures (e.g., octrees, quadtrees, BSP trees, sparse voxel octrees, 3D arrays, and k-d trees). The physics processor 118 may perform algorithms that provide an approximate simulation of certain physical systems, such as rigid body dynamics (including collision detection and crowd steering), soft body dynamics, mass particle dynamics, and fluid dynamics. The communications unit 120 may include a dedicated transceiver to receive and send communication signals from and to antennas. Preferably, the transceivers are millimeter-wave (mmW) transceivers. The rendering engine 122 may perform rendering algorithms on data in order to synthesize images to generate photorealistic 3D models.

In some embodiments, the communications unit 120 includes hardware configured to receive wireless radio waves from antennas and to send the data back to the antennas, which may as well be used for enabling an accurate tracking of the host system. In some embodiments, mmW transceivers may be employed, which may be configured to receive mmW wave signals from antennas and to send the data back to antennas. In some embodiments, tracking may be performed employing several techniques known in the art, such as time of arrival (TOA), angle of arrival (AOA), or other tracking techniques known in the art (e.g., visual imaging, radar technology, etc.).

In another embodiment, the communications unit 120 implements, in hardware, a distributed ledger-based communications pipeline between users of a host device including an electronic chip 100c according to embodiments of the current disclosure. The distributed ledger-based communications pipeline may enable direct communication between users through a decentralized network by allowing storage of information in a secure and accurate manner using cryptography, employing cryptographic "keys" and cryptographic signatures. Once the information is stored, the data becomes an immutable database and is governed by rules of the network.

Figure 1D:
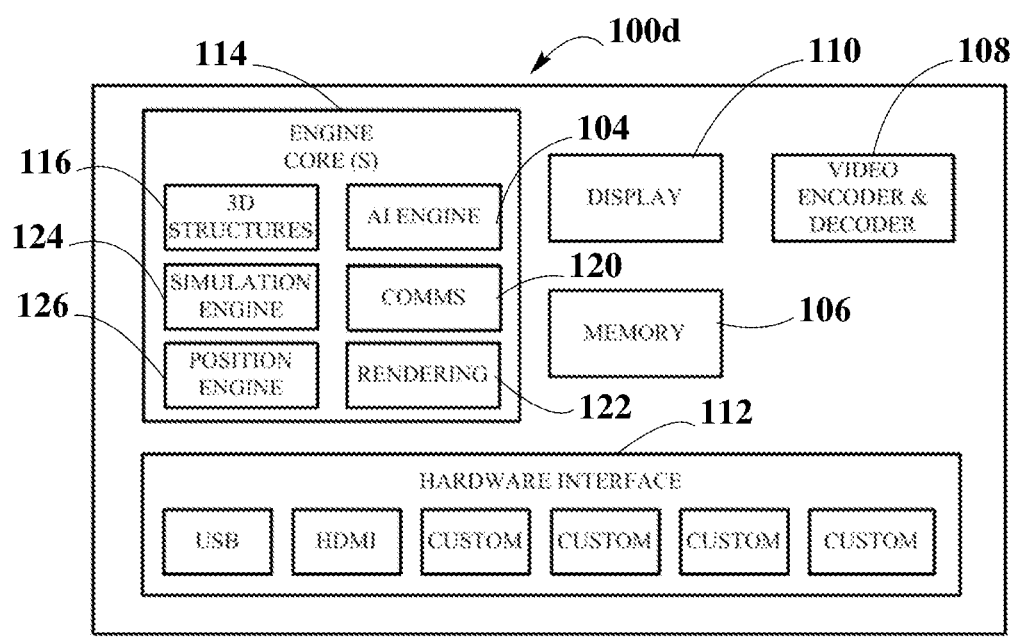

FIG. 1D depicts an embodiment of a chip 100d implementing a 3D structures processor 116, an artificial intelligence engine 104, a simulation engine 124, a communications unit 120, a position engine 126, and a rendering engine 122, each implemented in hardware by dedicated circuitry in a common engine core 114. By implementing dedicated circuitry for each of the 3D structures processor 116, an artificial intelligence engine 104, a simulation engine 124, a communications unit 120, a position engine 126, and a rendering engine 122 on a single engine core 114, functionality of each of these components is enhanced because of being assigned dedicated hardware for their specific function. The chip 100d may additionally include a memory 106 or memory controller (not shown), a video encoder and decoder 108, a display 110, and a hardware interface 112 configured to have a functionality similar to that described in FIG. 1A. Additional functions of the 3D structures processor 116, AI engine 104, communications unit 120, and rendering engine 122 not herein described may be similar to the functions in the description with reference to FIG. 1C.

Chip 100d may act as a position-based game and/or simulation engine and artificial intelligence engine 104, providing an accurate position and orientation that may drive a plurality of applications. In some embodiments, the 3D structures processor 116 requests the position and orientation of a client device implementing chip 100d to the position engine 126 in order to increase the accuracy of the position and orientation of the client device with respect to other elements around a user. In some embodiments, the position engine 126 may be configured to perform hardware-based algorithms to calculate position and orientation of respective devices based on global satellite navigation system (GNSS) radio signals, which refers collectively to multiple satellite-based navigation systems such as GPS, BDS, Glonass, Galileo, QZSS, and IRNSS, and thereby through techniques such as triangulation or trilateration, perform hardware-based algorithms to calculate position of respective client devices In other embodiments, the position engine may further communicate to the communications unit 120 and obtain further position data of respective client devices through cellular network positioning techniques using 4G antennas, mmW or cmW antennas (e.g., through 5G networks), or combinations thereof, by employing antenna triangulation methods such as TOA and AOA; may utilize indoor tracking techniques such as WiFi; or may utilize other tracking techniques known in the art, such as visual imaging and radar technology. In other embodiments, the position engine 126 may further obtain position-and-orientation-related sensory data from one or more sensory mechanisms connected to the chip 100d via the hardware interface 112, such as one or more Inertia Measuring Unit (IMU), accelerometers, gyroscopes, cameras, eye-tracking sensors, and the like. In other embodiments, the position engine 126 may further request and obtain position-and-orientation data of respective client devices from the 3D structures processor 116, whereby the 3D structure of entities around a user and the 3D structure of a user (e.g., the 3D structure of a 3D user avatar) can provide the position engine 126 with further information to calculate the position and orientation of the respective client device. In other embodiments, the position engine 126 can calculate the position and orientation of respective client devices by combining methods described above.

The simulation engine 124 may comprise dedicated hardware circuitry configured to implement algorithms for simulating the behavior, functions and abstract or physical properties of real-world objects into virtual replicas in a virtual world, and to predict such characteristics. The simulation engine 124 may obtain a plurality of data related to each real-world object through various methods, such as by inputting data sets through a virtual replica editor (not shown) that may be part of a computer aided drawing (CAD) software or other similar system, by inputting sensory data of each of the real-world objects that can serve to enrich and/or complement the input data, or by using combinations thereof. For example, the real-world object data may be obtained by inputting a building information model (BIM), which provides a plurality of features related to the appearance and operations of a building. In another example, the real-world object data may be obtained by inputting the virtual model of a car providing a plurality of features related to the appearance and operations of the car. In another example, radar-imaging, such as synthetic-aperture radars, real-aperture radars, AVTIS radars, Light Detection and Ranging (LIDAR), inverse aperture radars, monopulse radars, and other types of imaging techniques may be used to map and model real world entities before integrating them into the virtual world.

The simulation engine 124 may further obtain a client device position and orientation data from the position engine 126 in order to simulate said position and orientation data into the virtual replica, or to further predict the position and orientation of the client device. By way of example, the simulation engine 124 may be used in a chip 100d implemented in a self-driving vehicle or drone in order to predict the immediate path of the self-driving vehicle or drone by obtaining the current position, orientation, speed and acceleration of the self-driving vehicle and using these data to interpolate the immediate path of the vehicle.

Figure 1E:
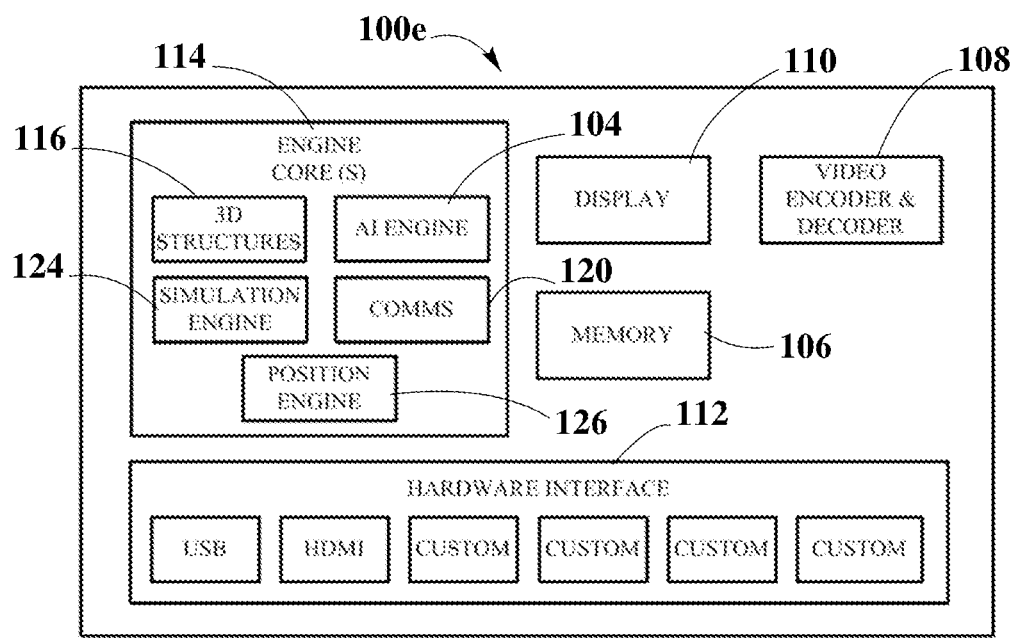

FIG. 1E depicts an embodiment of a chip 100e implementing a 3D structures processor 116, an artificial intelligence engine 104, a simulation engine 124, a communications unit 120, a position engine 126, and a rendering engine 122, each implemented in hardware by dedicated circuitry in a common engine core 114. By implementing dedicated circuitry for each of the 3D structures processor 116, an artificial intelligence engine 104, a simulation engine 124, a communications unit 120, a position engine 126, and a rendering engine 122 on a single engine core 114, functionality of each of these components is enhanced because of being assigned dedicated hardware for their specific function. The chip 100d may additionally include a memory 106 or memory controller (not shown), a video encoder and decoder 108, a display 110, and a hardware interface 112 configured to have a functionality similar to that described in FIG. 1A. Additional functions of the 3D structures processor 116, AI engine 104 and communications unit 120 not herein described may be similar to the functions in the description with reference to FIG. 1C.

Chip 100e differs from chip 100d in that chip 100e does not include a rendering engine. Thus, chip 100e may enable a position-based game and/or simulation engine and artificial intelligence engine to support a client device by providing a position-based 3D structures processing, machine learning processing, and simulation processing, but may leave the rendering to be implemented directly in a client device or cloud server including an EPU of the current disclosure, which may be desired for providing a personalized rendering.

Figure 2A:
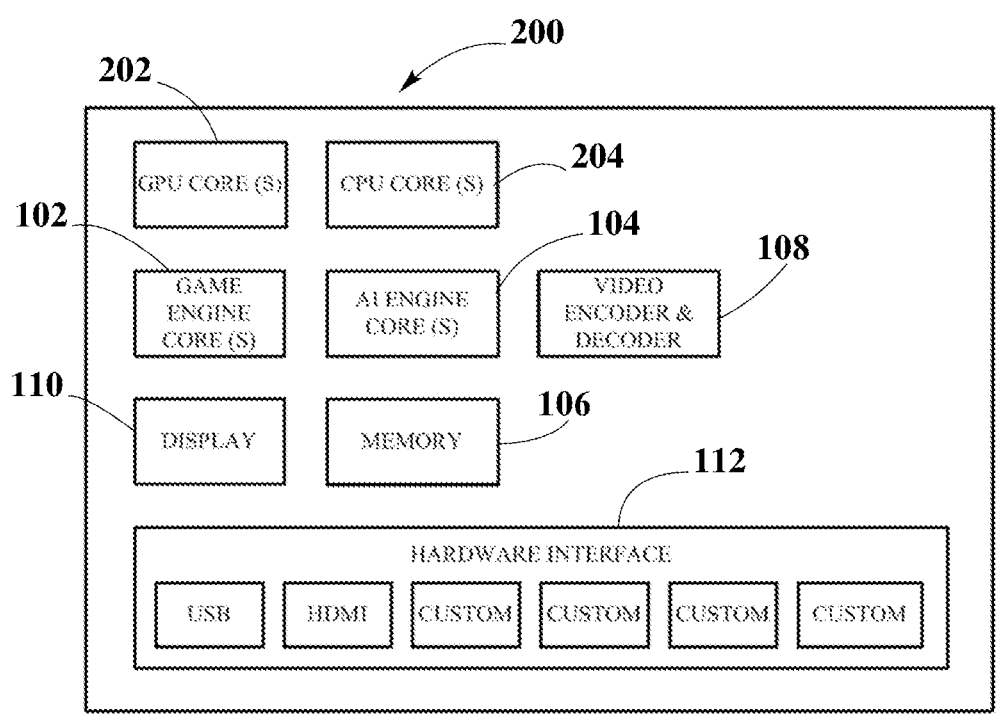
FIGS. 2A-2C illustrate schematic views of an electronic chip including one or more hardwired game and/or simulation engines, one or more artificial intelligence engines, a GPU and a CPU, according to an embodiment.
Figure 2B:
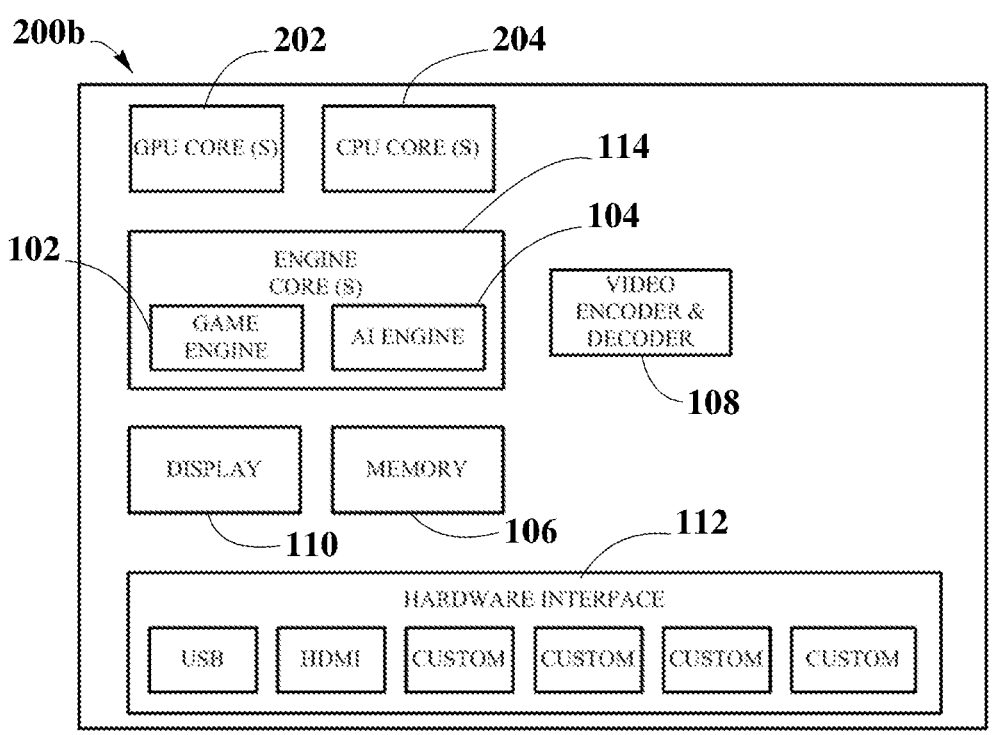
Figure 2C:
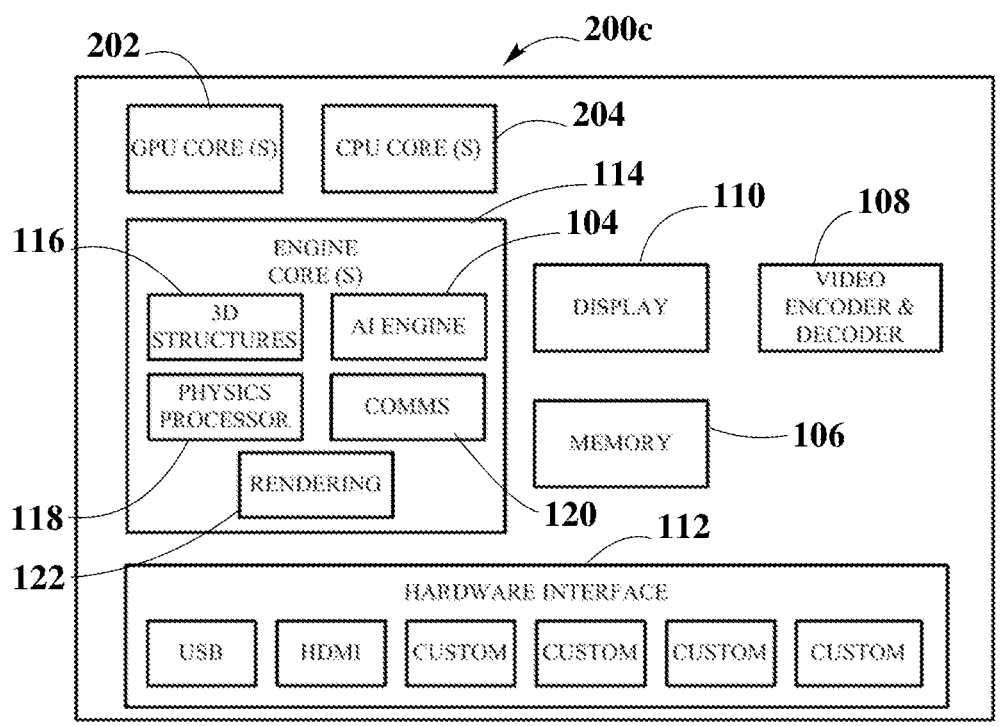

FIGS. 2A-2C illustrate schematic views of another embodiment of an electronic chip of the current disclosure. The chips 200, 200b, 200c of FIGS. 2A-2C may include similar elements as those of the chip of FIGS. 1A-1C, and may therefore contain the same or similar reference numbers.

The chip 200 depicted in FIG. 2A includes one or more hardwired game and/or simulation engines 102, one or more hardwired artificial intelligence engines 104, a graphics processing unit (GPU) 202 and a central processing unit (CPU) 204, according to an embodiment. The chip 200 may additionally include a memory 106 or memory controller (not shown), a video encoder and decoder 108, a display 110, and a hardware interface 112.

The functionality of the CPU 204 may be the same or similar to that of existing CPUs. The CPU 204 may allow an execution of software according to an instruction set architecture directly on chip 200. The software may be dedicated to processing of the game and/or simulation engine 102 and/or artificial intelligence engine 104. However, the CPU 204 is not restrictive to processing of the game and/or simulation engine 102 and/or artificial intelligence engine 104 only but may, rather, execute any kind of software which may exploit the functionality of the electronic chip 200. The electronic circuitry may include at least one respective microcontroller, microprocessor or digital signal processor (DSP) on the single electronic chip 200 in any combination. In order to enable operation of the central processing unit, the electronic chip 200 may further comprise memory blocks, such as a selection of ROM, RAM, EEPROM and/or flash memory, timing sources including oscillators and phase-locked loops, peripherals including counter timers, real-time timers and power-on reset generators, external interfaces, such as USB, Firewire, Ethernet, SPI, and the like, analog interfaces including ADCs and DACs, voltage regulators and power management circuits on the electronic chip 200, in any combination. Some of these components may form part of the electronic circuitry realizing the at least one processing core implementing the central processing unit while others may be separate and dedicated components of the electronic chip 200 that are realized by one or more electronic circuits implementing the desired functionality. The game and/or simulation engine 102 and artificial intelligence engine 104 may be directly coupled to the CPU 204 and/or may utilize a buffer or memory to exchange data between the central processing unit and the game and/or simulation engine 102. The central processing unit may also include further interfaces to directly couple to the hardwired game and/or simulation engine 102 and hardwired artificial intelligence engine 104.

The GPU 202 can be regarded as a hardwired graphics processing unit on the electronic chip 200. The at least one hardware interface 112 may include a media interface, such as HDMI and the like, which may provide data rendered by the on-chip graphics processing unit to a display 110 or screen. However, it is to be understood that the graphics processing unit may also interface, via the hardware interface 112, with a bus or other interconnect of a host system to provide the rendered data for display.

In some embodiments, the GPU 202 is configured to retrieve and process data from the game and/or simulation engine 102 and/or from the artificial intelligence engine 104. The game and/or simulation engine 102 and artificial intelligence engine 104 may pre-process input data that may be suitable for processing on the specialized hardware of the GPU 202, which may include SIMD processing or vector processing as is known in the art. The preprocessed data may be provided to the on-chip GPU 202, which may further process the data and/or generate a final rendering of the graphics scene based on the preprocessed data or for providing complementary machine learning algorithm processing. The GPU 202 may also provide the results to the game and/or simulation engine 102 and artificial intelligence engine 104 for further processing. Hence, the game and/or simulation engine 102 and artificial intelligence engine 104 may prepare data or data sets and offload specific tasks to the GPU 202 in order to exploit the GPU 202 functionality or the specialized hardware of the GPU 202.

In some embodiments, the game and/or simulation engine 102 and artificial intelligence engine 104 may store the preprocessed data in the memory 106 and may issue a command to the on-chip GPU 202 to read and further process the data. The on-chip GPU 202 may use the memory 106 or a different communication channel to communicate the results to the hardwired game and/or simulation engine 102 and/or artificial intelligence engine 104. A register or a register set may be used to control properties of the memory 106, to indicate characteristics of the stored data and/or to control operation of the on-chip GPU 202.

In yet another embodiment, the GPU 202 is connected to a video memory and the game and/or simulation engine 102 and artificial intelligence engine 104 are configured to provide data to the GPU 202 via the video memory 106. The on-chip GPU 202 may be connected to a dedicated video memory 106, which may be used internally by the GPU 202 to load, store or buffer data during processing of the GPU 202. The video memory may be located on an interposer as a stack of memory 106 chips. The video memory may be further coupled, for example, via the at least one hardware interface 112, to the at least one processing core implementing the game and/or simulation engine 102 or to the at least one processing core implement the artificial intelligence engine 104, thereby enabling the game and/or simulation engine 102 and artificial intelligence engine 104 to directly load and store data to the video memory. This may further improve speed and throughput of data exchange between the hardwired game and/or simulation engine 102, the artificial intelligence engine 104, and the on-chip GPU 202 without departing from a standard design of the GPU 202, which may simplify the design and fabrication of the chip 200.

In an alternative embodiment, the game and/or simulation engine 102 and artificial intelligence engine 104 are configured to communicate data via the hardware interface 112 with an external GPU (not shown). The game and/or simulation engine 102 and artificial intelligence engine 104 may receive data from an external entity, such as a CPU or GPU, via the at least one hardware interface 112. The game and/or simulation engine 102 and artificial intelligence engine 104 may send processed data via the hardware interface 112 to the external entity or another external entity. Preferably, the hardware interface 112 may be a bus interface or an external interface. The processed data may be supplied to the external GPU for further processing and/or rendering on a target display, or for providing complementary machine learning algorithm processing.

FIG. 2B depicts an embodiment whereby a chip 200b implements a game and/or simulation engine 102 with a dedicated artificial intelligence engine 104 implemented in one common processing core, or engine core 114, where the chip 100 further includes a GPU 202 and a CPU 204. Providing the game and/or simulation engine 102 and artificial intelligence engine 104 on a single, common hardware processing core may reduce processing times by enabling fast communication via short data links. Additionally, implementing an artificial intelligence engine 104 dedicated to a single game and/or simulation engine 102 may improve efficiency because the artificial intelligence engine 104 may only need to process data from the game and/or simulation engine 102 to which the artificial intelligence engine 104 is dedicated. The functionality of the GPU 202 and CPU 204 may be similar to that described in FIG. 2A. The chip 200b may additionally include a memory 106 or memory controller (not shown), a video encoder and decoder 108, a display 110, and a hardware interface 112.

FIG. 2C depicts an embodiment of a chip 200c implementing a 3D structures processor 116, an artificial intelligence engine 104, a physics processor 118, a communications unit 120, and a rendering engine 122, each implemented in hardware by dedicated circuitry in a common engine core 114, and further comprising a on-chip GPU 202 and an on-chip CPU 204. The GPU 202 and CPU 204 may be similar to that described in FIG. 2A. Furthermore, the functionality of the 3D structures processor 116, artificial intelligence engine 104, physics processor 118, communications unit 120, and rendering engine 122 may be similar to that described in FIG. 1C. The chip 200c may additionally include a memory 106 or memory controller (not shown), a video encoder and decoder 108, a display 110, and a hardware interface 112.

Figure 3A:
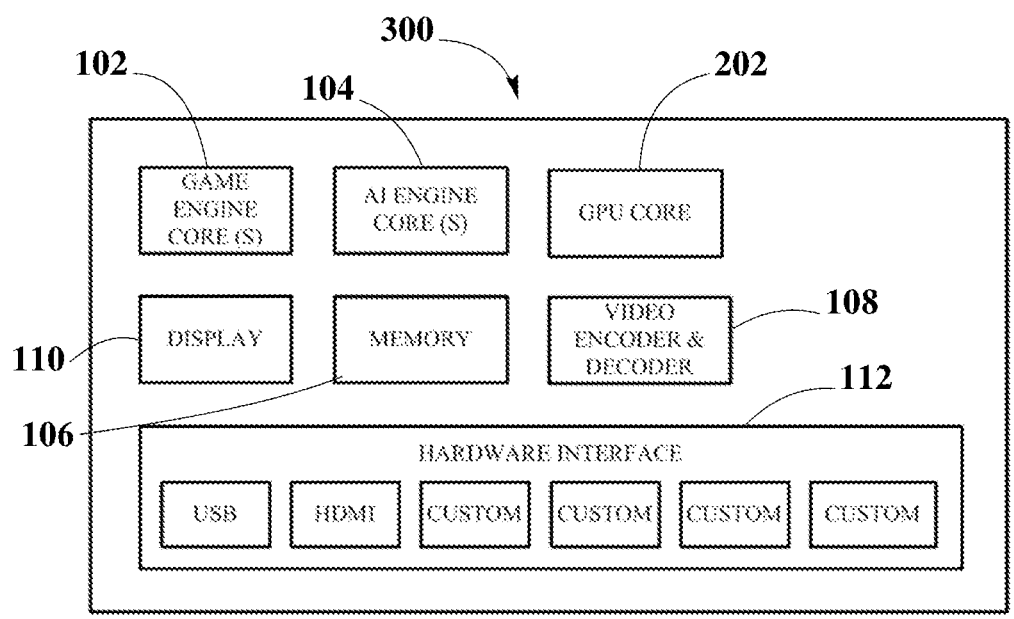
FIGS. 3A-3C illustrate schematic views of an electronic chip including one or more hardwired game and/or simulation engines, one or more artificial intelligence engines, and a GPU, according to an embodiment.
Figure 3B:
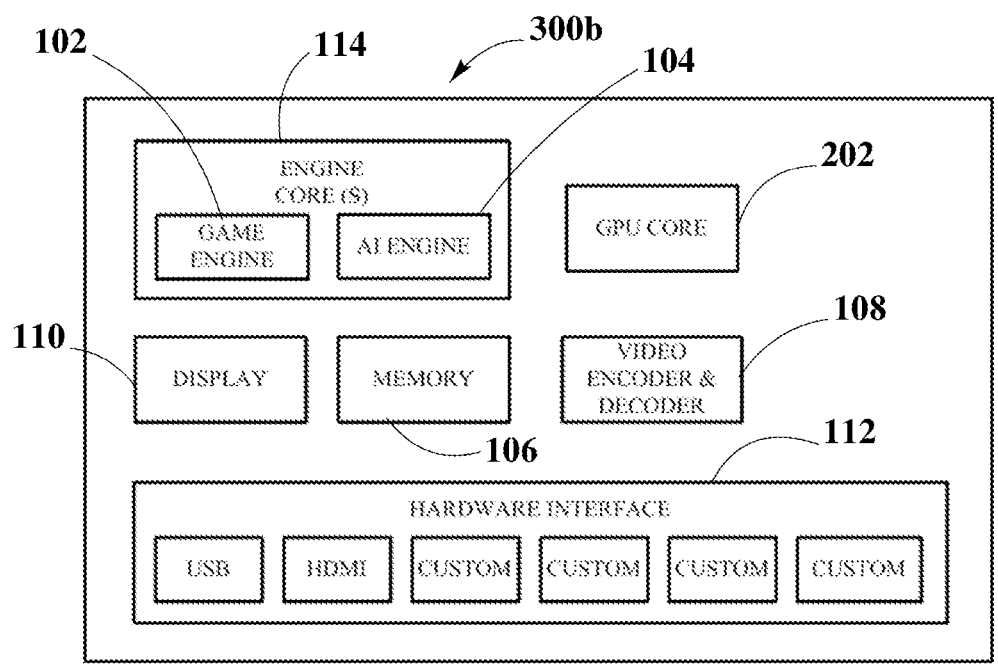
Figure 3C:
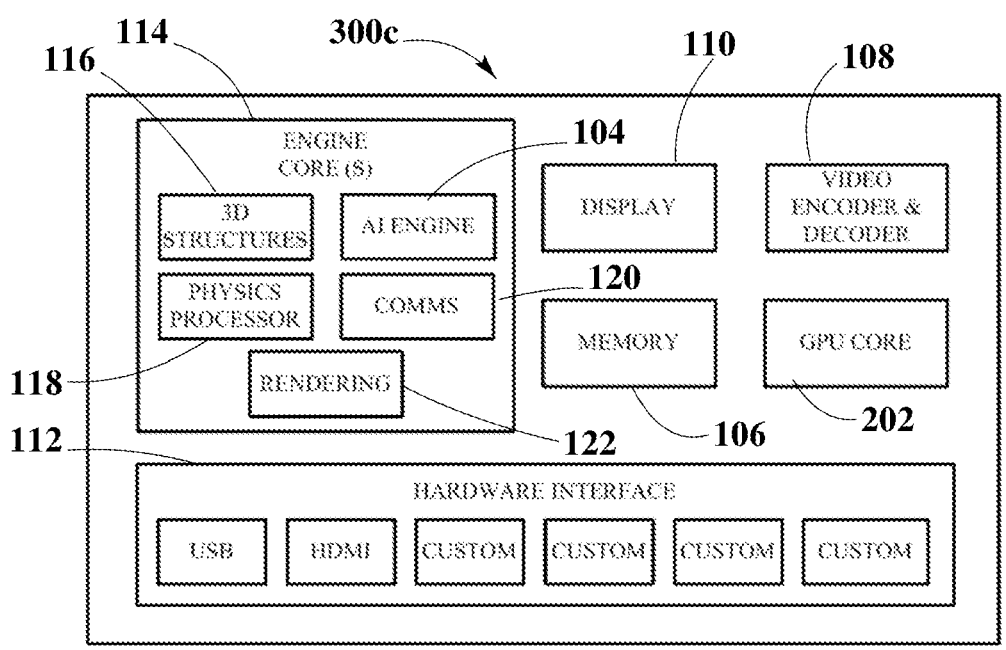

FIGS. 3A-3C illustrate schematic views of another embodiment of an electronic chip of the current disclosure. The chips 300, 300b, 300c of FIGS. 3A-3C may include similar elements as those of the chips of FIGS. 1A-2C, and may therefore contain the same or similar reference numbers.

A chip 300 of FIG. 3A may include one or more hardwired game and/or simulation engines 102, one or more hardwired artificial intelligence engines 104, and a GPU 202. The chip 300 may additionally include a memory 106 or memory controller (not shown), a video encoder and decoder 108, a display 110, and a hardware interface 112. The chip 300 may be embodied as a stand-alone "discrete" graphics processor or stand-alone discrete graphics processor package with enhanced machine learning processing capabilities, where the package may contain one or more integrated circuits. Chip 300 may be incorporated into a stand-alone discrete graphics processor chip or package, where the graphics processor chip or package may include one or more integrated circuits. Multiple integrated circuits in a package could be, for instance, connected to each other with the use of an interposer and/or by stacking and/or by using a similar fabrication processes.

FIG. 3B depicts a chip 300b implementing a game and/or simulation engine 102 with a dedicated artificial intelligence engine 104 implemented in one common processing core, or engine core 114, where the chip 300b further includes a GPU 202. The chip 300b may additionally include a memory 106 or memory controller (not shown), a video encoder and decoder 108, a display 110, and a hardware interface 112. Providing the game and/or simulation engine 102 and artificial intelligence engine 104 on a single, common hardware processing core may reduce processing times by enabling fast communication via short data links. Additionally, implementing an artificial intelligence engine 104 dedicated to a single game and/or simulation engine 102 may improve efficiency because the artificial intelligence engine 104 may only need to process data from the game and/or simulation engine 102 to which the artificial intelligence engine 104 is dedicated. The functionality of the GPU 202 may be similar to that described in FIG. 2A.

FIG. 3C depicts an embodiment of a chip 300c implementing a 3D structures processor 116, an artificial intelligence engine 104, a physics processor 118, a communications unit 120, and a rendering engine 122, each implemented in hardware by dedicated circuitry in a common engine core 114, and further comprising a on-chip GPU 202. The functionality of the GPU 202 may be similar to that described in FIG. 2A. Furthermore, the functionality of the 3D structures processor 116, artificial intelligence engine 104, physics processor 118, communications unit 120, and rendering engine 122 may be similar to that described in FIG. 1C. The chip 300c may additionally include a memory 106 or memory controller (not shown), a video encoder and decoder 108, a display 110, and a hardware interface 112.

Figure 4A:
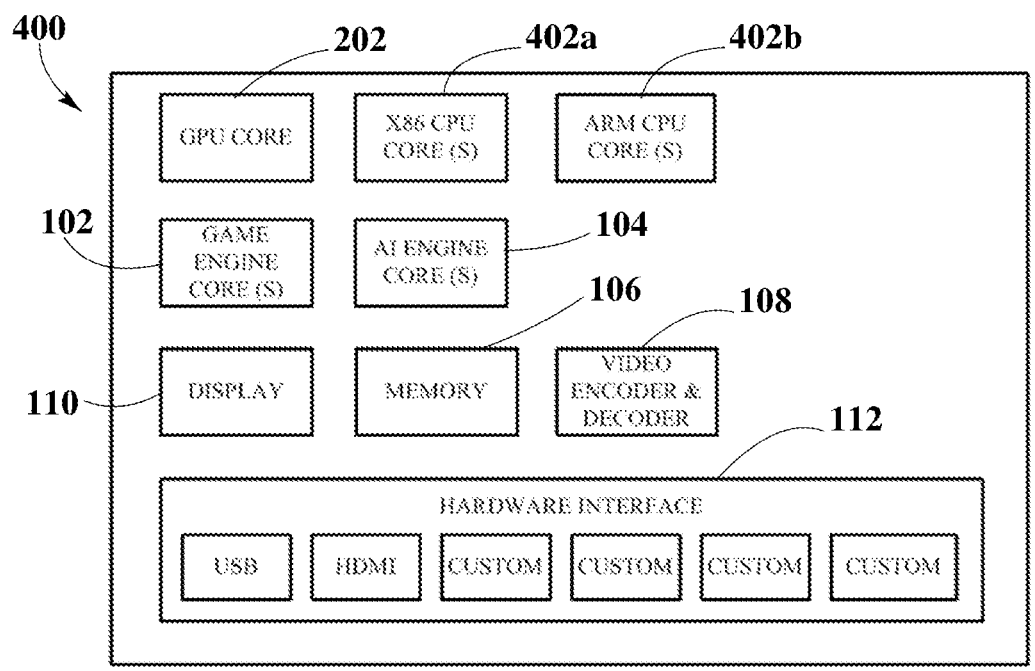
FIGS. 4A-4C illustrate an implementation of the electronic chip including one or more hardwired game and/or simulation engines, one or more artificial intelligence engines, a GPU, and a plurality of CPUs, according to an embodiment.
Figure 4B:
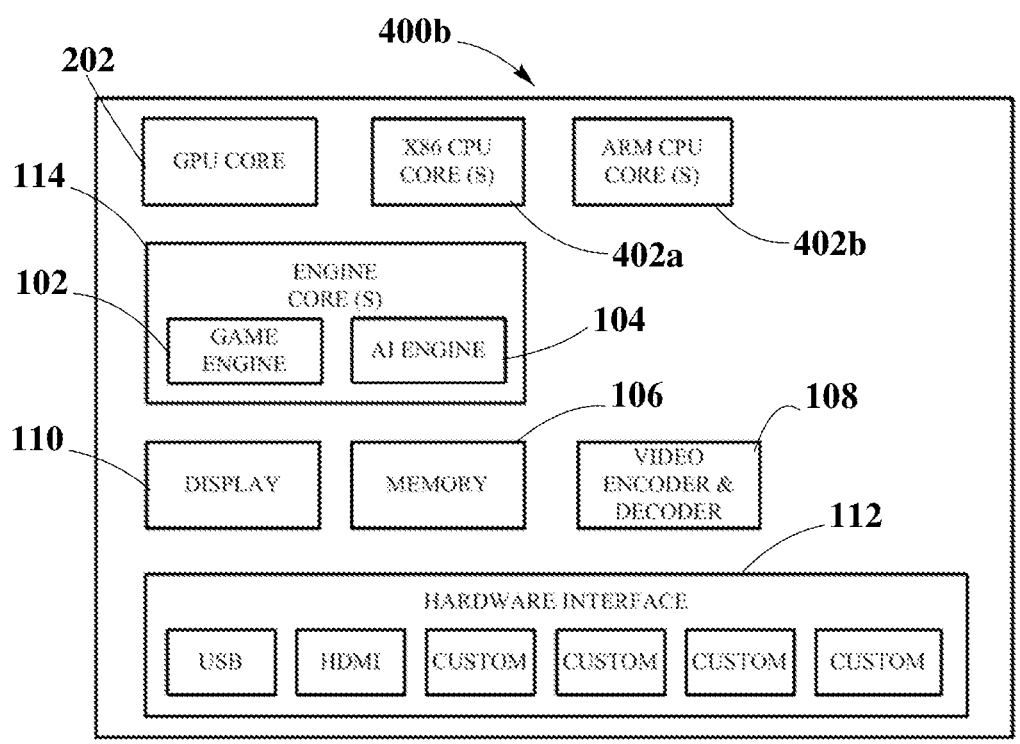
Figure 4C:
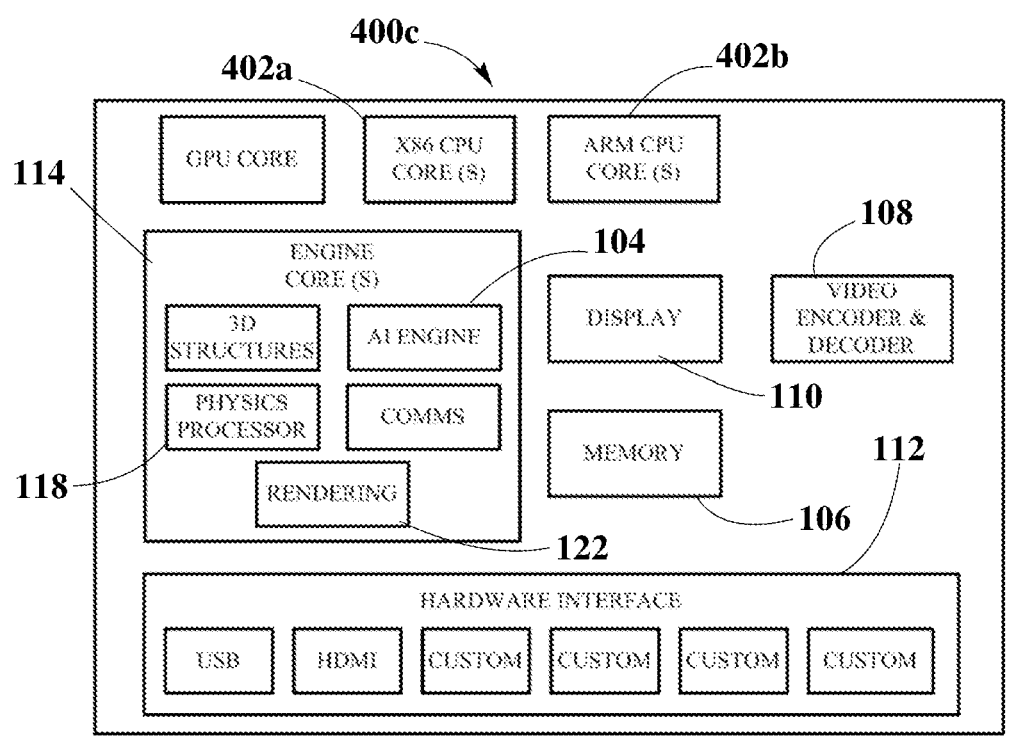

FIGS. 4A-4C depict schematic views of another embodiment of an electronic chip of the current disclosure. The chips 400, 400b, 400c of FIGS. 4A-4C may include similar elements as those of the chips of FIGS. 1A-3C, and may therefore contain the same or similar reference numbers.

A chip 400 of FIG. 4A may include one or more hardwired game and/or simulation engines 102, one or more hardwired artificial intelligence engines 104, a GPU 202, and a plurality of CPUs 402a and 402b where each CPU may be configured to execute instructions according to a different instruction set architecture. The hardwired game and/or simulation engine 102 and coupled artificial intelligence engines 104 along with the multiple types of CPUs 402a and 402b may be incorporated into a single hardware device, such as a SOC. Using the plurality of CPUs 402a and 402b, the chip 400 may be able to run software compiled for different platforms, systems or architecture, for instance, but not limited to systems based on Intel's x86 architecture as commonly used in personal computers and systems based on the ARM instruction set, which may be typically used in mobile phones and tablets, by directing respective instructions to either CPU 402a and/or to CPU 402b. The chip 400 may include logic to determine, for each program code to be executed on the chip 400, an architecture for which the program code was compiled and to assign the program code to a respective CPU. In one embodiment, an instruction set architecture that may be suitable for use by software employed by the EPU includes an extendable instruction set computer (EISC) architecture, which may be designed specifically to perform high-level operations required by the on-chip game and/or simulation engine and on-chip artificial intelligence. In other embodiments, instruction set architectures such as the complex instruction set architecture (CISC), the reduced instruction set architecture (RISC), or other suitable instruction set architectures known in the art may be used by software employed by the EPU.

Even though FIG. 4A shows only two types of CPUs 402a and 402b, it is to be understood that other types of CPUs for execution of instructions according to other instruction set architectures can be used without departing from the scope of the present disclosure. The chip 200b may additionally include a memory 106 or memory controller (not shown), a video encoder and decoder 108, a display 110, and a hardware interface 112.

FIG. 4B depicts a chip 400b implementing a game and/or simulation engine 102 with a dedicated artificial intelligence engine 104 implemented in one common processing core, or engine core 114, where the chip 400b further includes, similar to FIG. 4A, a plurality of CPUs 402a and 402b. The chip 400b may additionally include a memory 106 or memory controller (not shown), a video encoder and decoder 108, a display 110, and a hardware interface 112.

FIG. 4C depicts a chip 400c implementing a 3D structures processor 116, an artificial intelligence engine 104, a physics processor 118, a communications unit 120, and a rendering engine 122, each implemented in hardware by dedicated circuitry in a common engine core 114, and further comprising, similar to FIGS. 4A and B, a plurality of CPUs 402a and 402b. The functionality of the 3D structures processor 116, artificial intelligence engine 104, physics processor 118, communications unit 120, and rendering engine 122 may be similar to that described in FIG. 1C. The chip 400c may additionally include a memory 106 or memory controller (not shown), a video encoder and decoder 108, a display 110, and a hardware interface 112.

Figure 5A:
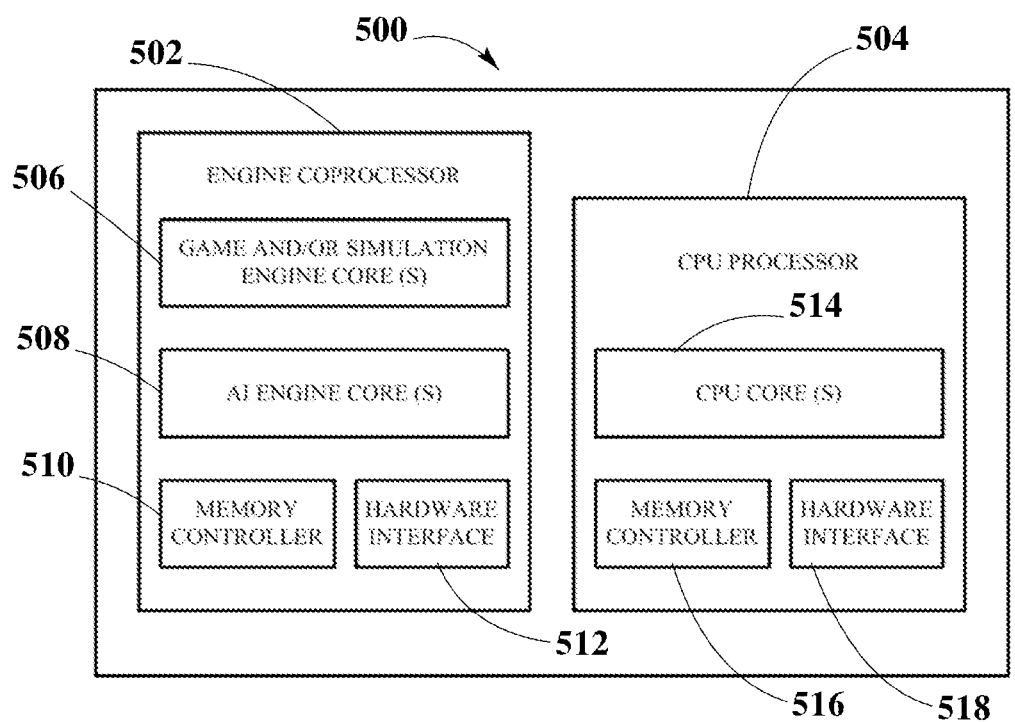
FIGS. 5A-5C illustrate a realization of an electronic chip of the current disclosure as a co-processor chip, according to an embodiment.
Figure 5B:
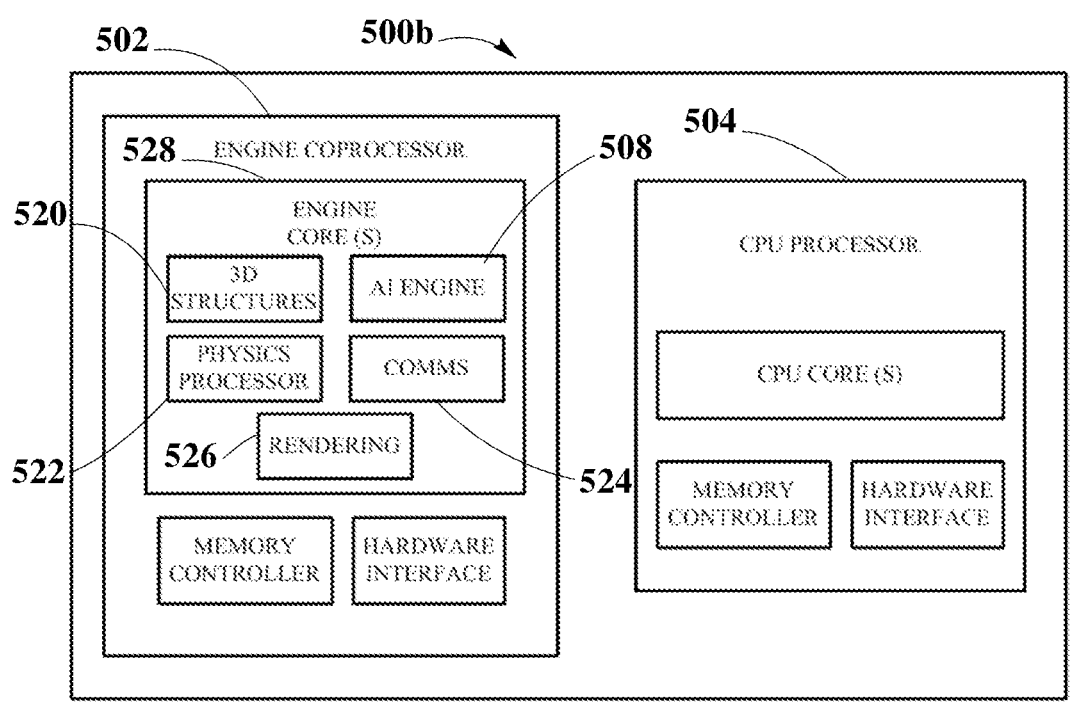
Figure 5C:
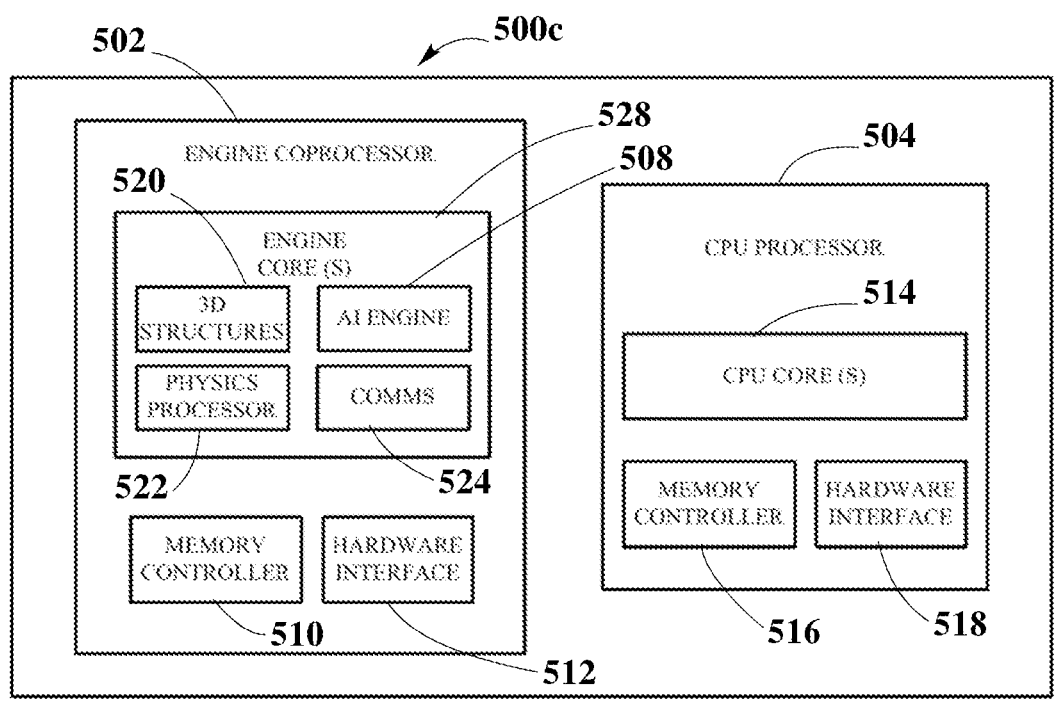

FIGS. 5A-5C show a system according to an embodiment of the current disclosure. The system 500, 500b, 500c of FIGS. 5A-C may include similar elements as those of the chips or chip assemblies of FIGS. 1A-4C, and may therefore contain the same or similar reference numbers.

The system 500 of FIG. 5A includes an engine coprocessor 502 together with a CPU coprocessor 504. The engine coprocessor 502 may include one or more chips as discussed above with regard to FIGS. 1A-4C. The engine coprocessor 502 may incorporate one or more hardwired game and/or simulation engines 506 and one or more hardwired artificial intelligence engines 508. The engine coprocessor 502 may further comprise a memory controller 510 and a hardware interface 512 to communicate with the CPU coprocessor 504. The CPU coprocessor 504 may include one or more CPU cores 514, a memory controller 516, and a hardware interface 518.

The system 500 including a CPU coprocessor 504 together with an engine coprocessor 502 may be used, for example, in a server, and may be configured to support edge-processing (i.e., processing performed by client devices, such as mobile phones or head-mounted displays). However, it may be understood that the system 500 may also be employed in a client device.

The engine coprocessor 502 can be understood as a separate chip, optionally with its own package, which may be connected to the CPU coprocessor 504 via an interface bus, such as a PCI express bus, or any other bus interface or interconnect. The engine coprocessor 502 may contain its own memory controller 510 where the memory may be located outside the engine coprocessor 502 or on the engine coprocessor 502.

The system 500 may further include one or more GPUs (not shown) and may comprise interfaces to connect to the one or more GPUs, for example, the PCI express bus. However, it is to be understood that any other interconnect or bus technology could be used to interconnect the CPU coprocessor 504 with the engine coprocessor 502 and the one or more GPUs.

The CPU coprocessor 504 may issue commands to the engine coprocessor 502, which may then prepare data sets and commands that can be communicated back to the CPU coprocessor 504 or via the hardware interfaces 512 and 518 to an external discrete GPU. A higher performance can be reached by offloading CPU tasks to the engine coprocessor 502 which may contain circuits specifically designed for these tasks.

The dedicated memory controller 510 on the engine coprocessor 502 may allow the engine coprocessor 502 to use its local memory to perform specific game and/or simulation engine tasks. This may advantageously improve performance by increasing I/O speed and bandwidth.

FIG. 5B depicts a system 500b including an engine coprocessor 502 together with a CPU coprocessor 504, where the engine coprocessor 502 further includes implementing a 3D structures processor 520, an artificial intelligence engine 508, a physics processor 522, a communications unit 524, and a rendering engine 526, each implemented in hardware by dedicated circuitry in a common engine core 528. The engine coprocessor 502 may further comprise a memory controller 510 and a hardware interface 512 to communicate with the CPU coprocessor 504. The CPU coprocessor 504 may include one or more CPU cores 514, a memory controller 516, and a hardware interface 518. The functionality of the CPU coprocessor 504 is similar to that described in FIG. 5A.

The system 500b including a CPU coprocessor 504 together with an engine coprocessor 502 including an engine core 528 may be used, for example, in a server, and may be configured to support edge-processing (i.e., processing performed by client devices, such as mobile phones or head-mounted displays), enhancing processing speeds if required by the applications. However, it may be understood that the system 500b may also be employed in a client device.

FIG. 5C depicts a system 500c including an engine coprocessor 502 together with a CPU coprocessor 504, where the engine coprocessor 502 further includes implementing a 3D structures processor 520, an artificial intelligence engine 508, a physics processor 522, and a communications unit 524, each implemented in hardware by dedicated circuitry in a common engine core 528. The engine coprocessor 502 may further comprise a memory controller 510 and a hardware interface 512 to communicate with the CPU coprocessor 504. The CPU coprocessor 504 may include one or more CPU cores 514, a memory controller 516, and a hardware interface 518. The functionality of the CPU coprocessor 504 is similar to that described in FIG. 5A.

System 500c differs from system 500b in that system 500c does not include a rendering engine. System 500c may be of particular use in embodiments where implementations are in a server in order to support edge-processing. In this embodiment, system 500c may support a client device by providing supplementary 3D structures processing, machine learning processing, and physics processing, but may leave the rendering to be implemented directly in a client device including an EPU of the current disclosure using a chip or SOC of FIGS. 1A-4C, which may be desired for providing a personalized rendering.

Figure 6A:
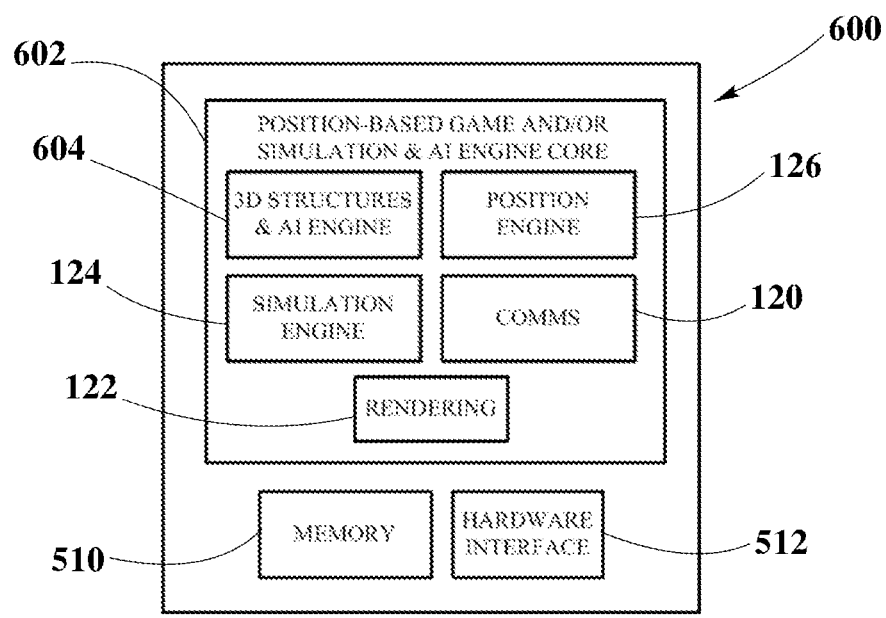
FIGS. 6A-6C illustrate a realization of an electronic chip of the current disclosure as a position-based game and/or simulation and artificial intelligence engine, according to an embodiment.
Figure 6B:
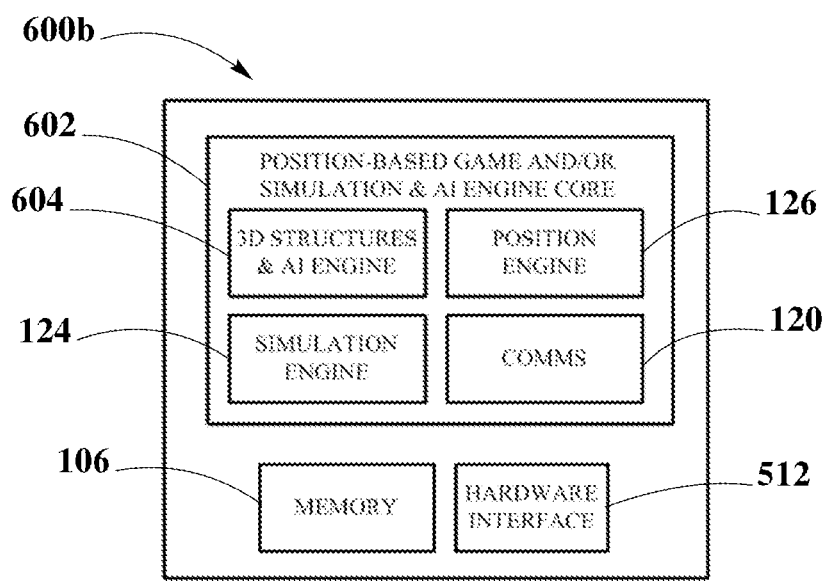
Figure 6C:
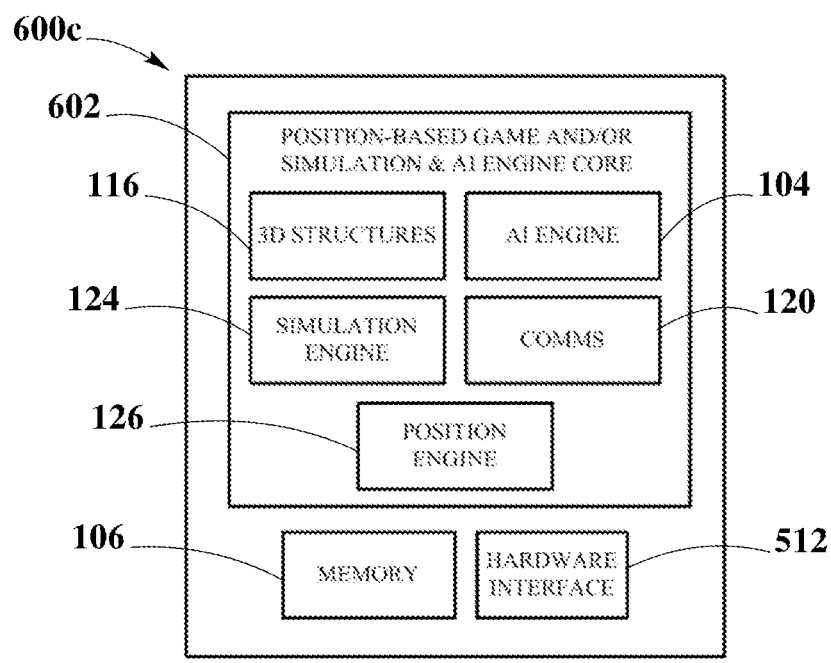

FIGS. 6A-6C depict schematic views of another embodiment of an electronic chip of the current disclosure. The chips 600, 600b, 600c of FIGS. 6A-C may include similar elements as those of the chips or chip assemblies of FIGS. 1A-5C, and may therefore contain the same or similar reference numbers.

The chip 600 of FIG. 6A includes a position-based game and/or simulation and AI engine core 602 incorporating one or more hardwired 3D structures and AI engine 604, a position engine 126, a simulation engine 124, a communications unit 120, and a rendering engine 122. By implementing dedicated circuitry for each of the 3D structures and AI engine 604, a position engine 126, a simulation engine 124, a communications unit 120, and a rendering engine 122 on a single engine core 114, functionality of each of these components is enhanced because of being assigned dedicated hardware for their specific function. The chip 600 may further comprise a memory 106 or memory controller and a hardware interface 512 configured to have a functionality similar to that described in FIG. 1A.

The chip 600 may act as a position-based game and/or simulation engine and artificial intelligence engine, providing an accurate position and orientation that may drive a plurality of applications. The 3D structures and AI engine 604 comprises dedicated circuitry implementing algorithms of both a 3D structures processor and an artificial intelligence engine, whereby the 3D structures processor part and the artificial intelligence engine part may operate as described with reference to FIG. 1D. Chip 600 differs from chip 100d of FIG. 1D in that chip 600 does not include a video encoder and decoder 108 and display 110, which functions may be implemented by dedicated hardware and/or software connected to the chip 600 via the hardware interface 112.

The chip 600b of FIG. 6B may provide similar functions as those of chip 600 of FIG. 6A, with the difference being that chip 600b does not include a rendering engine. Thus, chip 600b may enable a position-based game and/or simulation engine and artificial intelligence engine to support a client device by providing a position-based 3D structures processing, machine learning processing, and simulation processing, but may leave the rendering to be implemented directly in a client device by a dedicated hardware and/or software module (e.g., a GPU and/or CPU) or cloud server including an EPU of the current disclosure, which may be desired for providing a personalized rendering.

The chip 600c of FIG. 6C may provide similar functions as those of chip 600 of FIG. 6A, with the difference being that the 3D structures and AI engine 604 of FIG. 6A are separated into hardwired components dedicated specifically to each function. Thus, the chip 600c of FIG. 6 comprises an individual 3D structures processor 116 and an individual artificial intelligence engine 104, while the rest of the components are the same as those of FIG. 6A.

Figure 7A:
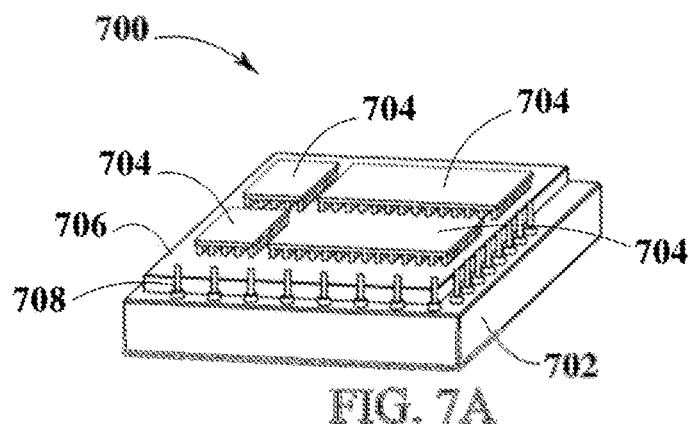
FIGS. 7A-7C illustrate various examples of chip assemblies according to embodiments of the present disclosure.
Figure 7B:
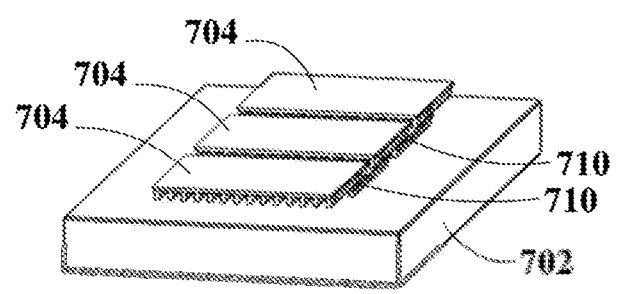
Figure 7C:
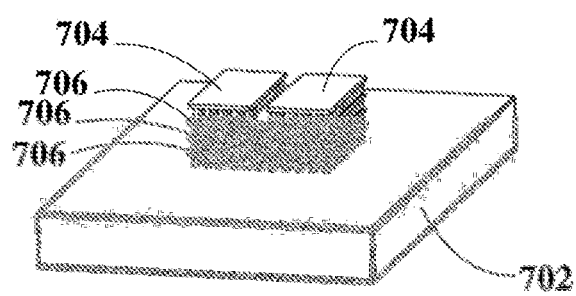

FIGS. 7A-7C illustrate various examples of chip assemblies 700 according to embodiments of the present disclosure. The chip assemblies 700 may include a package substrate 702, a plurality of sub-chips 704, and an interposer 706. The chip assembly 700 may be configured on the package substrate 702 via the interposer 706. The plurality of sub-chips 704 may together constitute the EPU according to the embodiments of the present disclosure and the plurality of sub-chips 704 may be interconnected via the interposer 706. The interposer 706 may itself be a large silicon die with metal interconnect layers that may be produced with chip production equipment. The metal interconnect layers on the interposer 706 may replace the interconnection layers that otherwise would interconnect various areas of a single chip.

In one embodiment shown in FIG. 7A the interposer 706 can be connected to the package substrate 702 using through-silicon-vias 708.

FIG. 7B shows yet another embodiment of a chip assembly 700 using another method of interconnecting the plurality of sub-chips 704 into a single EPU. In this exemplary embodiment, the various sub-chips 704 may be integrated into the chip assembly using micro-bridges 710 that may be embedded in the package substrate 702. The micro-bridges 710 may be themselves silicon dies with metal interconnect layers produced by chip production equipment. The metal interconnect layers on the micro-bridges 710 may replace the interconnection layers that otherwise would interconnect various areas of a single chip.

FIG. 7C shows yet another example embodiment of a chip assembly 700. In this example embodiment, the plurality of sub-chips 704 may be interconnected vertically into the chip assembly, placed on the package substrate 702. This may also be referred to as 3D chip stacking. Interconnecting sub-chips 704 vertically may use, for example, though-silicon-vias, such as the through-silicon-vias 708 of FIG. 7A, or use inductive coupling technology to enable near field wireless communication between 3D stacked chips.

Figure 8A:
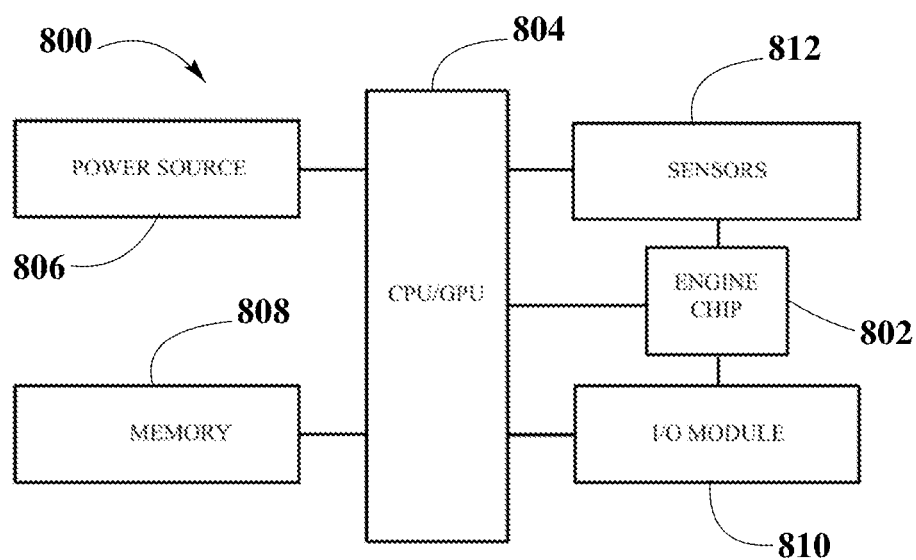
FIGS. 8A-8B illustrate a computing device implementing an electronic chip of the current disclosure.
Figure 8B:
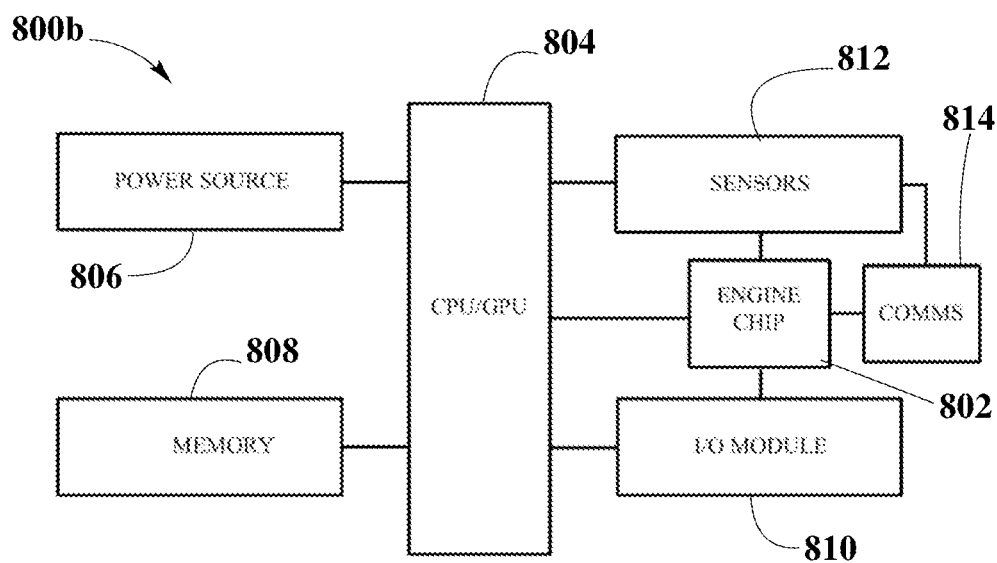

FIGS. 8A-8B illustrates a computing device 800 implementing an electronic chip of the current disclosure.

The computing device 800 of FIG. 8A includes at least one chip 802 or chip assembly according to embodiments of the current disclosure, a host CPU and GPU 804, a power source 806, a memory 808, an I/O module 810, and sensory mechanisms 812. The chip 802 or chip assembly may thus be used to support the host CPU and GPU 804 by performing game and/or simulation engine tasks and machine learning algorithms as disclosed. The computing device 800 may be a mobile device, a head-mounted display, a personal computer, a game console, a server computer, and the like.

The chip 802, and CPU and GPU 804 may display the same functionality as described in FIGS. 1A-7B.

The power source 806 is implemented as computing hardware configured to provide power to the computing device 800. In one embodiment, the power source 806 may be a battery. The power source 806 may be built into the computing device 800 or removable from the computing device 800, and may be rechargeable or non-rechargeable. In one embodiment, the computing device 800 may be repowered by replacing one power source 806 with another power source 806. In another embodiment, the power source 806 may be recharged by a cable attached to a charging source, such as a universal serial bus ("USB") FireWire, Ethernet, Thunderbolt, or headphone cable, attached to a personal computer. In yet another embodiment, the power source 806 may be recharged by inductive charging, wherein an electromagnetic field is used to transfer energy from an inductive charger to the power source 806 when the two are brought in close proximity, but need not be plugged into one another via a cable. In another embodiment, a docking station may be used to facilitate charging.

The memory 808 may be implemented as computing software and hardware adapted to store application program instructions of the computing device 800 from the sensory mechanisms 812 or from data input by users through the I/O module 810. The memory 808 may be of any suitable type capable of storing information accessible by the CPU/GPU 804 and chip 802, including a computer-readable medium, or other medium that stores data that may be read with the aid of an electronic device, such as a hard-drive, memory card, flash drive, ROM, RAM, DVD or other optical disks, as well as other write-capable and read-only memories. The memory 808 may include temporary storage in addition to persistent storage.

The I/O module 810 of the computing device 800 may be implemented as computing hardware and software configured to interact with users and provide user input data to one or more other system components. For example, I/O module 810 may be configured to interact with users, generate user input data based on the interaction, and provide the user input data to the chip 802 and CPU/GPU 804. In another example, I/O modules 810 is implemented as an external computing pointing device (e.g., a touch screen, mouse, 3D control, joystick, gamepad, and the like) and/or text entry device (e.g., a keyboard, dictation tool, and the like) configured to interact with computing device 800. In yet other embodiments, I/O module 810 may provide additional, fewer, or different functionality to that described above.

The sensory mechanisms 812 may be implemented as computing software and hardware adapted to obtain various sensory data from users. The sensory mechanisms 812 may include, for example, one or more of an Inertia Measuring Unit (IMU), accelerometers, gyroscopes, light sensor, haptic sensors, a camera, eye-tracking sensors, and a microphone, amongst others. The IMU is configured to measure and report the velocity, acceleration, angular momentum, speed of translation, speed of rotation, and other telemetry metadata of the computing device 800 by using a combination of accelerometers and gyroscopes. Accelerometers within the IMU may be configured to measure the acceleration of the interaction device, including the acceleration due to the Earth's gravitational field. In one embodiment, accelerometers within the IMU may include a tri-axial accelerometer that is capable of measuring acceleration in three orthogonal directions. In other embodiments one, two, three, or more separate accelerometers may be included within the IMU. In other embodiments, additional accelerometers and gyroscopes may be included separate from the IMU. The light sensors, haptic sensors, camera, eye-tracking sensors, and microphone may be used to capture input details from a user and his or her environment, which may be transmitted to the CPU/GPU 804 and chip 802 for further processing.

The computing device 800b of FIG. 8B comprises at least one chip 802 or chip assembly according to embodiments of the current disclosure, a host CPU and GPU 804, a power source 806, a memory 808, an I/O module 810, sensory mechanisms 812, and a communications unit 814. The chip 802 or chip assembly may thus be used to support the host CPU and GPU 804 by performing game and/or simulation engine tasks and machine learning algorithms as disclosed. The computing device 800 may be a mobile device, a head-mounted display, a personal computer, a game console, a server computer, and the like.

The computing device 800b, unlike the computing device 800, further comprises dedicated hardware circuitry and/or software implementing a communications unit 814 which may function as described with reference to FIGS. 1A-7C.

Figure 9:
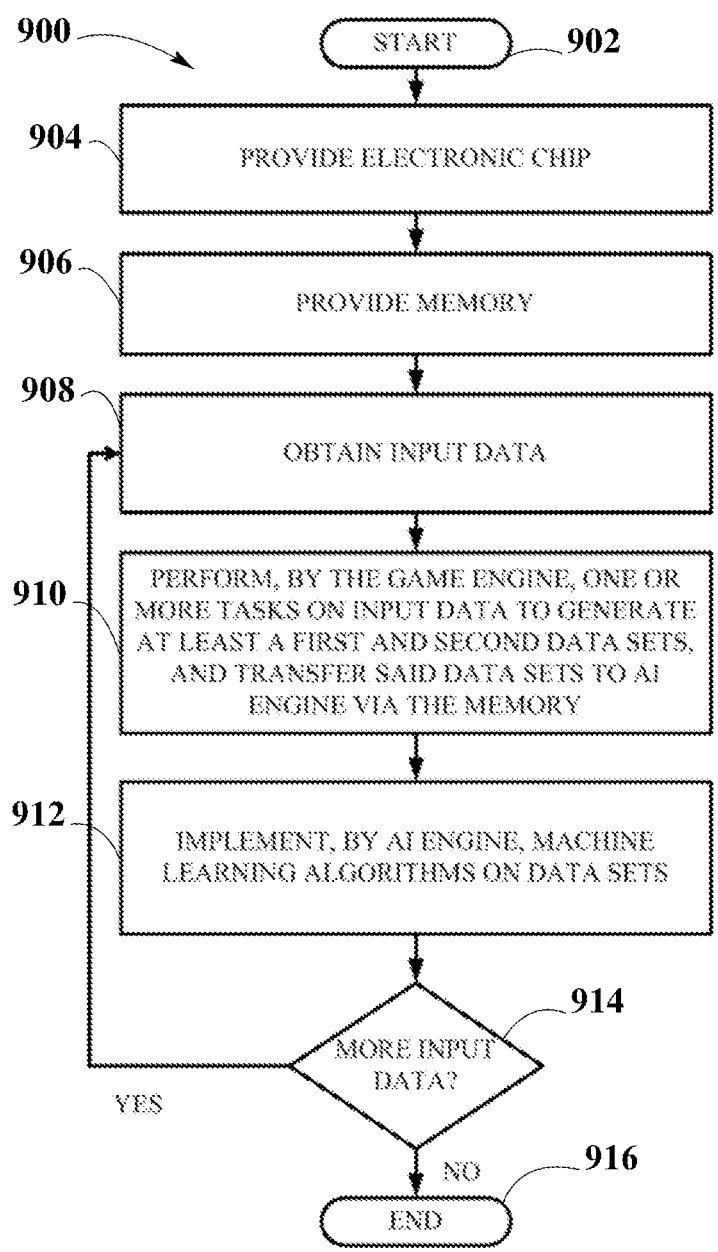
FIG. 9 illustrates a method enabling accelerated graphics processing and machine learning algorithm computations, according to an embodiment.

FIG. 9 illustrates a method enabling accelerated graphics processing and machine learning algorithm computations, according to an embodiment. Method 900 may be implemented in a system such as described in FIGS. 1A-8B. The method 900 starts at steps 902 and 904 by providing, on a computing device, at least one electronic chip including at least a hardware interface, and one or more processing cores including one or more game and/or simulation engines and one or more coupled artificial intelligence engines. Subsequently, the method 900 continues in step 906 by providing an on-chip memory or memory controller communicatively connected to an external memory. The memory may be used to store input data that may be thereafter retrieved by the one or more processing cores, such as the one or more game and/or simulation engines and artificial intelligence engines.

Method 900 continues in step 908 obtaining input data, and transferring the data to the game and/or simulation engine via the memory. The input data may refer to data input by users (e.g., application developers or a final user of an application) or sensory data obtained by sensory mechanisms. For example, the sensory mechanisms may include those described with reference to FIGS. 8A-B. Subsequently, method 900 follows in step 910 by performing, by the one or more hardwired game and/or simulation engines, one or more tasks on the sensory data in order to generate at least a first and a second data set, and transferring the data sets to the artificial intelligence engine via the memory. Then, method 900 proceeds in step 912 by implementing, by the artificial intelligence engine, machine learning algorithms on the data sets, which may be used for training of the artificial intelligence engine of the chip or SOC and for inferring new data by the artificial intelligence engine of the chip or SOC.

The method 900 continues in check 914 by checking whether there is more input data. In positive case, the method 900 may loop back to step 908 by obtaining the new data. Otherwise, if there is not anymore input data, the method 900 may end, as viewed in terminator 916.

The terminology used herein is for the purpose of describing particular embodiments only and is not intended to be limiting of the invention. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean any of the following: A; B; C; A and B; A and C; B and C; A, B and C." An exception to this definition will occur only when a combination of elements, functions, steps or acts are in some way inherently mutually exclusive.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

The embodiments of the invention in which an exclusive property or privilege is claimed are defined as follows:

1. An electronic chip comprising:
   a plurality of processing cores; and
   at least one hardware interface coupled to the plurality of processing cores, wherein at least one processing core of the plurality of processing cores includes a first engine, wherein the first engine comprises a game engine implemented in hardware by dedicated circuitry or a simulation engine implemented in hardware by dedicated circuitry, wherein at least one of the processing cores includes a machine learning artificial intelligence engine implemented in hardware by dedicated circuitry, wherein the first engine is coupled to the machine learning artificial intelligence engine; and
   a memory configured to store input data and data sets generated by the first engine during execution of a 3D application and to provide the data sets to the machine learning artificial intelligence engine for training of the machine learning artificial intelligence engine or for inference operations by the machine learning artificial intelligence engine.

2. The chip according to claim 1, wherein the input data comprises data input by a user via a programming interface, sensory data captured by sensing mechanisms, or combinations thereof.

3. The chip according to claim 1, wherein the data sets comprise a first data set comprising contextual data, and a second data set comprising target data.

4. The chip according to claim 3, wherein the contextual data comprise one or more of the following data types: 3D image data, 3D geometries, 3D entities, 3D sensory data, 3D dynamic objects, video data, audio data, textual data, time data, position and orientation data, and lighting data of the environment surrounding a user device; and wherein the target data comprise one or more of the following data types: 3D image data including 3D geometries, video data, audio data, position and orientation data and textual data related to a target to be recognized by machine learning algorithms.

5. The chip according to claim 1, wherein the machine learning artificial intelligence engine is configured to perform machine learning algorithms on the data sets, the algorithms comprising Naïve Bayes Classifiers Algorithms, Nearest Neighbours Algorithms, K Means Clustering Algorithms, Support Vectors Algorithms, Apriori Algorithms, Linear Regression Algorithms, Logistic Regression Algorithms, Neural Network Algorithms, Random Forest Algorithms, and Decision Tree Algorithms.

6. The chip according to claim 1, wherein the machine learning artificial intelligence engine comprises dedicated electronic circuitry for performing operations optimally for tensor operations for machine learning.

7. The chip according to claim 1, wherein the first engine and the machine learning artificial intelligence engine are implemented on at least one common processing core.

8. The chip according to claim 7, wherein the first engine on the common processing core is further separated into individual components comprising a 3D structures processor, a communications unit, and a physics processor or simulation processor.

9. The chip according to claim 8, further comprising a rendering engine.

10. The chip according to claim 8, further comprising a position engine configured to receive radio signals from global navigation satellite systems (GNSS), and to compute position and orientation of corresponding client devices by performing one or more hardware-based algorithms based on data obtained from satellite tracking systems, antenna triangulation, sensory data from one or more sensory mechanisms connected to the chip, 3D structures, or combinations thereof.

11. The chip according to claim 8, wherein the communications unit is further configured to enable tracking of a host system through time of arrival (TOA) and angle of arrival (AOA).

12. The chip according to claim 8, wherein the communications unit is further configured to implement, in hardware, a distributed ledger-based communications pipeline between users of host devices.

13. The chip according to claim 1, wherein at least one of the processing cores implements a central processing unit.

14. The chip according to claim 1, wherein at least one of the processing cores implements a graphics processing unit.

15. The chip according to claim 14, wherein the graphics processing unit includes a video memory, and wherein the first engine is configured to provide data to the graphics processing unit via the video memory.

16. A chip assembly comprising:
   at least one chip, wherein the at least one chip comprises:
      one or more processing cores;
      at least one hardware interface coupled to at least one of the one or more processing cores; and
      a memory,
      wherein at least one of the one or more processing cores includes a game engine implemented in hardware by dedicated circuitry or a simulation engine implemented in hardware by dedicated circuitry, wherein at least one of the one or more processing cores includes a machine learning artificial intelligence engine implemented in hardware by dedicated circuitry, and
      wherein the memory is configured to store input data and data sets generated by the first engine during execution of a 3D application and to provide the data sets to the machine learning artificial intelligence engine for training of the machine learning artificial intelligence engine or for inference operations by the machine learning artificial intelligence engine.

17. The chip assembly according to claim 16, further comprising at least one graphics processing unit, wherein the at least one graphics processing unit is connected to the at least one hardware interface of the chip.

18. The chip assembly according to claim 16, further comprising a plurality of stacked integrated circuits, wherein an integrated circuit is stacked on top of another integrated circuit or on an interposer chip.

19. A processing core comprising:
   a game engine implemented in hardware by dedicated circuitry or a simulation engine implemented in hardware by dedicated circuitry; and
   a machine learning artificial intelligence engine implemented in hardware by dedicated circuitry,
   wherein the machine learning artificial intelligence engine is configured to obtain from memory input data and data sets generated by the game engine or simulation engine during execution of a 3D application for training of the machine learning artificial intelligence engine or for inference operations by the machine learning artificial intelligence engine.

* * * * *